(12) United States Patent
Karhade et al.

(10) Patent No.: US 11,222,877 B2
(45) Date of Patent: Jan. 11, 2022

(54) THERMALLY COUPLED PACKAGE-ON-PACKAGE SEMICONDUCTOR PACKAGES

(71) Applicant: Intel Corporation, Santa Clara, CA (US)

(72) Inventors: Omkar Karhade, Chandler, AZ (US); Robert L. Sankman, Phoenix, AZ (US); Nitin A. Deshpande, Chandler, AZ (US); Mitul Modi, Phoenix, AZ (US); Thomas J. De Bonis, Tempe, AZ (US); Robert M. Nickerson, Chandler, AZ (US); Zhimin Wan, Chandler, AZ (US); Haifa Hariri, Phoenix, AZ (US); Sri Chaitra J. Chavali, Chandler, AZ (US); Nazmiye Acikgoz Akbay, Chandler, AZ (US); Fadi Y. Hafez, Phoenix, AZ (US); Christopher L. Rumer, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,235

(22) Filed: Sep. 29, 2017

(65) Prior Publication Data
US 2019/0103385 A1    Apr. 4, 2019

(51) Int. Cl.
*H01L 25/10*       (2006.01)
*H01L 23/367*      (2006.01)
(Continued)

(52) U.S. Cl.
CPC .......... *H01L 25/105* (2013.01); *H01L 23/367* (2013.01); *H01L 23/3736* (2013.01);
(Continued)

(58) Field of Classification Search
CPC ....... H01L 25/10; H01L 25/105; H01L 25/50; H01L 23/36; H01L 23/367; H01L 23/37;
(Continued)

(56) References Cited

U.S. PATENT DOCUMENTS 5,691,041 A *  11/1997  Frankeny ............... H05K 3/325
                                                    257/712
7,705,447 B2 *  4/2010  Ganesan ............... H01L 23/367
                                                    257/713
(Continued)

*Primary Examiner* — Monica D Harrison
(74) *Attorney, Agent, or Firm* — Schwabe, Williamson & Wyatt, P.C.

(57) ABSTRACT

The present disclosure is directed to systems and methods for improving heat distribution and heat removal efficiency in PoP semiconductor packages. A PoP semiconductor package includes a first semiconductor package that is physically, communicably, and conductively coupled to a stacked second semiconductor package. A thermally conductive member that includes at least one thermally conductive member may be disposed between the first semiconductor package and the second semiconductor package. The thermally conductive member may include: a single thermally conductive element; multiple thermally conductive elements; or a core that includes at least one thermally conductive element. The thermally conductive elements are thermally conductively coupled to an upper surface of the first semiconductor package and to the lower surface of the second semiconductor package to facilitate the transfer of heat from the first semiconductor package to the second semiconductor package.

25 Claims, 9 Drawing Sheets

(51) Int. Cl.
  *H01L 25/00*   (2006.01)
  *H01L 23/373*  (2006.01)
  *H01L 23/42*   (2006.01)
  *H01L 23/498*  (2006.01)

(52) U.S. Cl.
  CPC .......... *H01L 23/3737* (2013.01); *H01L 23/42* (2013.01); *H01L 23/49811* (2013.01); *H01L 23/49827* (2013.01); *H01L 25/50* (2013.01); *H01L 2224/48227* (2013.01); *H01L 2224/73204* (2013.01); *H01L 2225/1058* (2013.01); *H01L 2225/1094* (2013.01); *H01L 2924/15311* (2013.01); *H01L 2924/181* (2013.01)

(58) Field of Classification Search
  CPC ............... H01L 23/373; H01L 23/3736; H01L 2225/1058; H01L 2225/1094
  USPC ....................................................... 257/712
  See application file for complete search history.

(56) References Cited

U.S. PATENT DOCUMENTS

| | | | |
|---|---|---|---|
| 2012/0241935 A1* | 9/2012 | Chou | H01L 25/105 257/686 |
| 2016/0190035 A1* | 6/2016 | Na | H01L 25/105 257/712 |
| 2016/0276308 A1* | 9/2016 | Min | H01L 23/367 |
| 2018/0269188 A1* | 9/2018 | Yu | H01L 23/14 |

\* cited by examiner

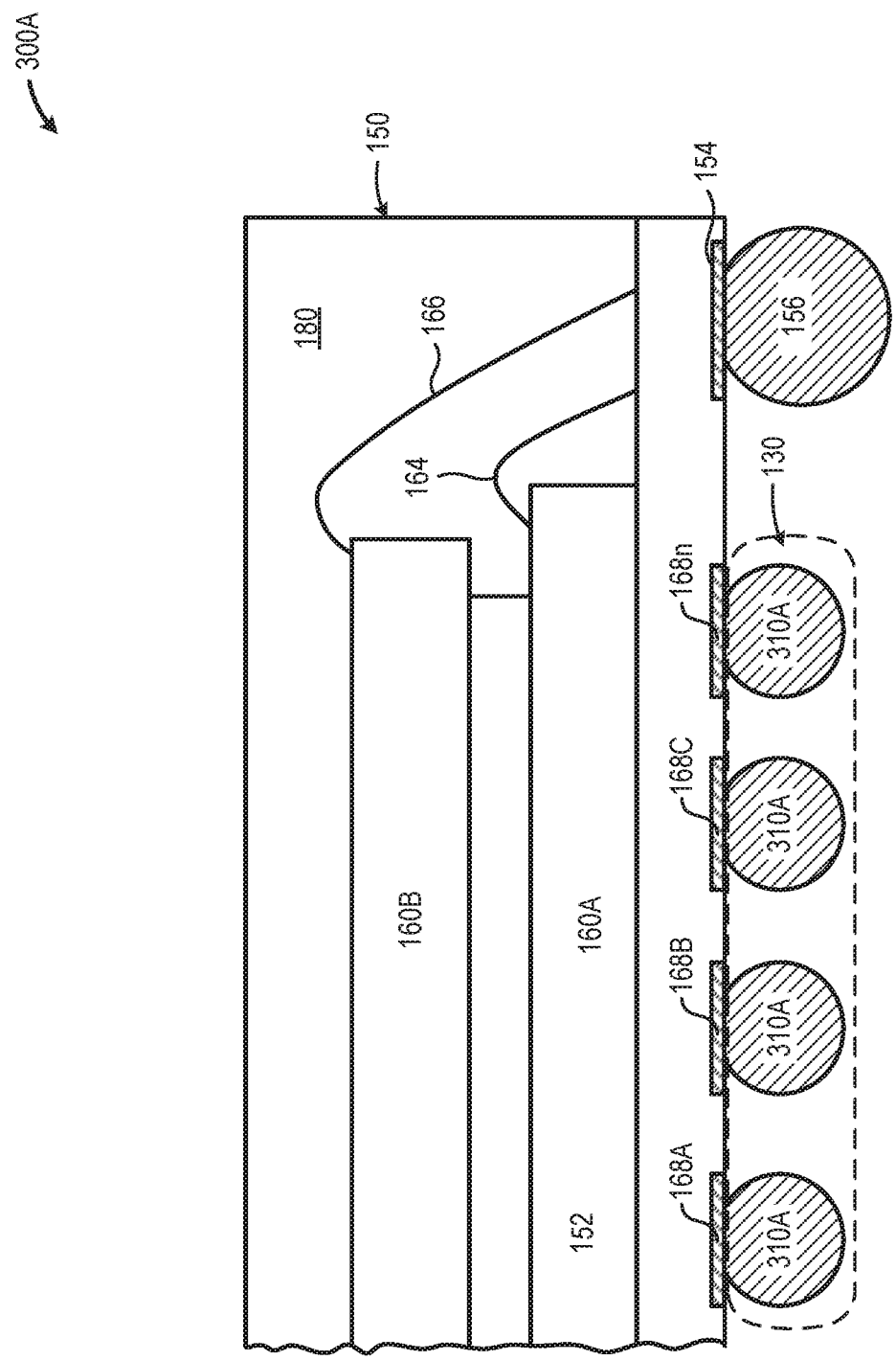

THERMALLY COUPLED PACKAGE-ON-PACKAGE SEMICONDUCTOR PACKAGES

TECHNICAL FIELD

The present disclosure relates to semiconductor fabrication and the transfer of thermal energy within a package-on-package semiconductor packages.

BACKGROUND

Package-on-package (PoP) is an integrated circuit packaging technology in which a number of ball grid array (BGA) packages are arranged vertically. PoP packaging beneficially reduces the board area occupied by individually semiconductor packages. PoP packaging also minimizes track length between components that frequently interoperate. Minimizing track length provides more rapid signal propagation, reduced noise, and reduced channel cross-talk. In assembly, PoP packaging permits the testing of individual components prior to stacking rather than after stacking (e.g., chip stacking), reducing rework since only known good components are used in the PoP package.

In a typical PoP integrated circuit a memory package is stacked with a logic package, such as a system-on-a-chip (SoC). Frequently, the stacked packages are stacked and then physically and conductively coupled via reforming. Since most semiconductor packages create heat when operating, heat produced by the semiconductor packages in the stack must be dissipated through a relatively small area. The reduced heat transfer within a PoP package leads to the formation of hot spots within the stack and, ultimately, to premature failure of the PoP package.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

FIG. 3A is a cross-sectional elevation of an illustrative second semiconductor package that includes a thermally conductively coupled thermally conductive member in the form of a plurality of solder balls, bumps, similar structures, each disposed proximate respective thermally conductive members on the lower surface of the second semiconductor package, in accordance with at least one embodiment described herein;

Figure 1:
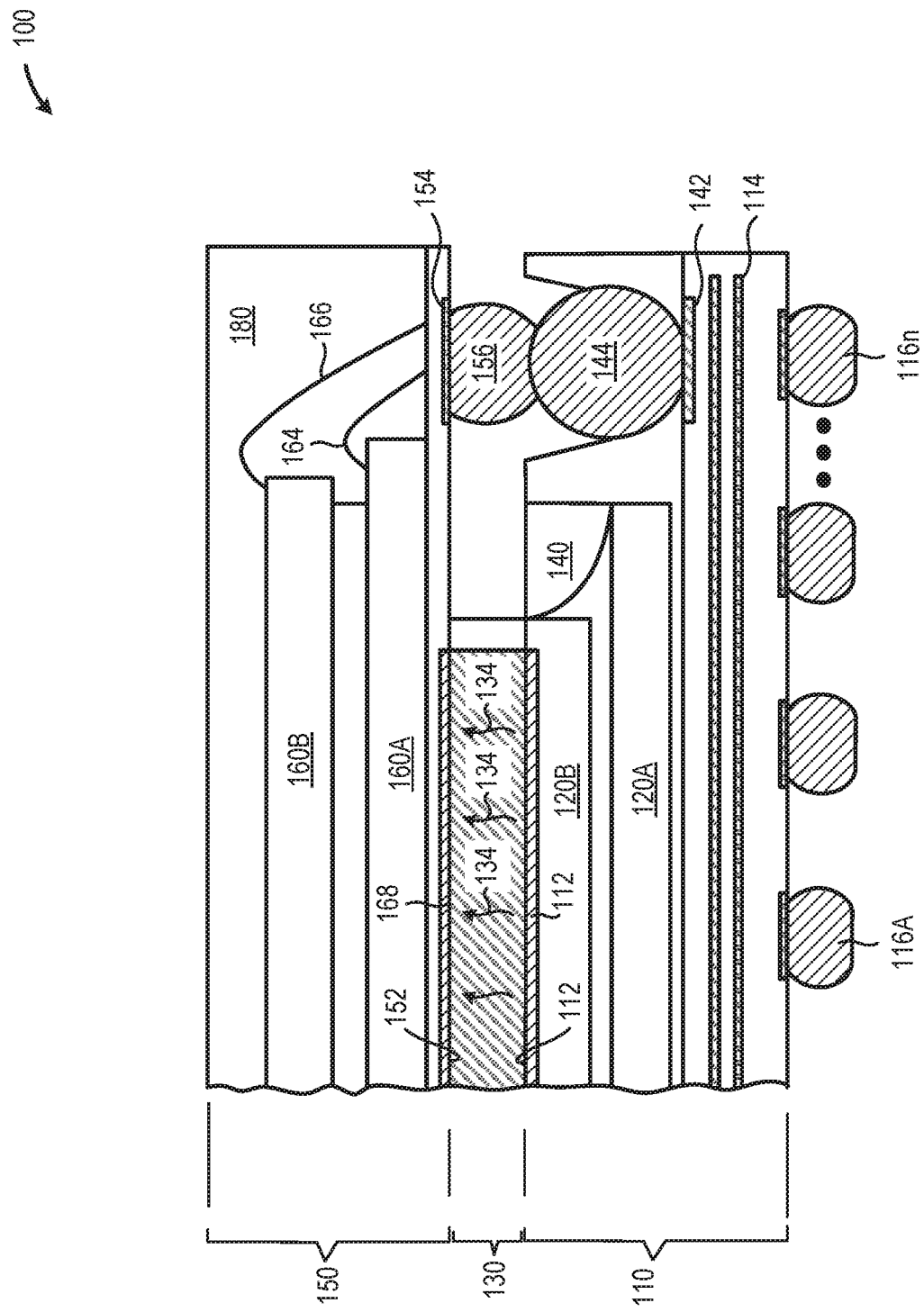
FIG. 1 is a cross-sectional elevation of an illustrative package-on-package (PoP) semiconductor package in which an interposer intermediate layer that includes at least one thermally conductive member disposed between an upper surface of a first semiconductor package and a lower surface of a second semiconductor package such that the thermally conductive member thermally conductively couples the first semiconductor package to the second semiconductor package, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems and methods disclosed herein provide for a package-on-package (PoP) construction using a thermally conductive member disposed between a first semiconductor package and a second semiconductor package. The thermally conductive member includes at least one thermally conductive element, fixture, appliance, and/or device that thermally conductively couples the upper surface of the first semiconductor package to the lower surface of the second semiconductor package. In embodiments, the at least one thermally conductive element, fixture, appliance, and/or device may include a solder pad that is disposed on the lower surface of the second semiconductor package and thermally conductively coupled to a thermally conductive layer disposed on the upper surface of the first semiconductor package during using a reflow process or method. In embodiments, the at least one thermally conductive element, fixture, appliance, and/or device may include a plurality of solder balls disposed on the lower surface of the second semiconductor package and thermally conductively coupled to the upper surface of the first semiconductor package during reflow. In embodiments, the at least one thermally conductive element, fixture, appliance, and/or device may include an interposer layer that includes a dielectric core having at least one conductive element that penetrating from an upper surface of the dielectric core to a lower surface of the dielectric core.

The thermally conductive member is positioned between a first (lower) semiconductor package and second (upper) semiconductor package to facilitate the distribution of heat in an x-y direction across the upper surface of the first semiconductor package, beneficially reducing the temperature of hot spots which form on the upper surface of the first semiconductor package (e.g., hot spots forming above microprocessors). The thermally conductive member may also facilitate the removal of heat in the z-direction by transferring heat generated by the lower first semiconductor package to the second semiconductor package for dissipation to the ambient environment.

Any number of thermally conductive members may be so positioned within a PoP semiconductor package. For example, in a PoP semiconductor package having three semiconductor stacked packages a thermally conductive member may be positioned between the lowermost and middle semiconductor packages and between the middle and uppermost semiconductor packages. In some implementations, a thermally conductive member may be positioned beneath the lowermost semiconductor package to facilitate heat transfer to the substrate on which the semiconductor package is mounted.

The thermally conductive member provides at least two benefits. First, the thermally conductive member physically couples the first semiconductor package to the second semiconductor package, improving the overall physical integrity of the PoP semiconductor package. Second, the thermally conductive member thermally conductively couples the lower first semiconductor package to the upper second semiconductor package, improving the heat distribution in an x-y direction across the upper surface of the first semiconductor package and also in a z-direction from the first semiconductor package to the second semiconductor package.

When compared to the physical and thermal performance of the disclosed thermally conductive member, the use of conventional liquid or paste adhesives to both physically and thermally couple semiconductor packages has several drawbacks. First, uniform application of an adhesive to a semiconductor package such that no gaps or voids exist within the cured adhesive is necessary to: ensure uniform heat distribution, avoid generating hotspots, and ensure near uniform heat transfer between semiconductor packages also to make sure that solder from POP balls does not extrude into the voids. Second, an over-application of adhesive to ensure adequate coverage leads to extrusion of the adhesive and potentially compromises the integrity of the conductive coupling between the semiconductor packages. Physically and thermally coupling the first semiconductor package and the second semiconductor package using an thermally conductive member that includes at least one thermally conductive structure that thermally couples the first semiconductor package to the second semiconductor package addresses these issues.

Generally, the systems and methods described herein provide greater thermal conductivity in the z-direction than PoP semiconductor packages in which an air gap or similar thermally disruptive structure or void is present between the first semiconductor package and the second semiconductor package. The systems and methods described herein also provide more uniform heat spreading across the surface (i.e., in the x-y direction) of the PoP semiconductor package. The systems and methods described herein also advantageously provide a PoP package having an overall lower z-height than overmolded PoP packages.

A package-on-package (PoP) semiconductor package is provided. The PoP semiconductor package may include: a first semiconductor package having an upper surface and a lower surface; a second semiconductor package having an upper surface and a lower surface; and an thermally conductive member disposed between the upper surface of the first semiconductor package and the lower surface of the second semiconductor package, the thermally conductive member including at least one continuous metallic, thermally conductive pathway between the upper surface of the first semiconductor package and the lower surface of the second semiconductor package.

A package-on-package (PoP) semiconductor package fabrication method is provided. The method may include: disposing an thermally conductive member between an upper surface of a first semiconductor package and a lower surface of a second semiconductor package; wherein the thermally conductive member includes at least one continuous metallic, thermally conductive, member; physically coupling the thermally conductive member to the upper surface of the first semiconductor package and the lower surface of the second semiconductor package; and thermally conductively coupling the thermally conductive member to the upper surface of the first semiconductor package and the lower surface of the second semiconductor package.

An electronic device is provided. The electronic device may include: a package-on-package (PoP) semiconductor package that includes: a first semiconductor package having an upper surface and a lower surface; a second semiconductor package having an upper surface and a lower surface; and an thermally conductive member disposed between the upper surface of the first semiconductor package and the lower surface of the second semiconductor package, the thermally conductive member including at least one continuous metallic, thermally conductive pathway between the upper surface of the first semiconductor package and the lower surface of the second semiconductor package.

A package-on-package (PoP) semiconductor package fabrication system is provided. The system may include: means for disposing an thermally conductive member between an upper surface of a first semiconductor package and a lower surface of a second semiconductor package; wherein the thermally conductive member includes at least one continuous metallic, thermally conductive, member; means for physically coupling the thermally conductive member to the upper surface of the first semiconductor package and the lower surface of the second semiconductor package; and means for thermally conductively coupling the thermally conductive member to the upper surface of the first semiconductor package and the lower surface of the second semiconductor package.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "logically associated" when used in reference to a number of objects, systems, or elements, is intended to convey the existence of a relationship between the objects, systems, or elements such that access to one object, system, or element exposes the remaining objects, systems, or elements having a "logical association" with or to the accessed object, system, or element. An example "logical association" exists between relational databases where access to an element in a first database may provide information and/or data from one or more elements in a number of additional databases, each having an identified relationship to the accessed element. In another example, if "A" is logically associated with "B," accessing "A" will expose or otherwise draw information and/or data from "B," and vice-versa.

FIG. 1 is a cross-sectional elevation of an illustrative package-on-package (PoP) semiconductor package 100 in which an thermally conductive member 130 that includes at least one thermally conductive element 132 disposed between an upper surface 112 of a first semiconductor package 110 and a lower surface 152 of a second semiconductor package 150 such that the thermally conductive element 132 thermally conductively couples 134 the first semiconductor package 110 to the second semiconductor package 150, in accordance with at least one embodiment described herein. In addition to thermally conductively coupling (i.e., in the z-direction) the first semiconductor package 110 to the second semiconductor package 150, the thermally conductive member 130 also facilitates a more even heat distribution across the upper surface 112 (i.e., in the x-y direction) of the first semiconductor package 110. More evenly distributing the heat across the upper surface 112 of the first semiconductor package 110 beneficially reduces the temperature of hotspots formed during the operation of the first semiconductor package 110.

The disclosed PoP semiconductor package 100, including a non-overmolded first semiconductor package 110, beneficially reduces the overall z-height of the PoP package 100, thereby permitting the use of such PoP semiconductor packages in low profile (i.e., "thinner") electronic device housings, such as smartphones, portable processor-based devices, wearable processor-based devices, compact Internet of Things (IoT) devices, and similar. Additionally, the disclosed PoP semiconductor package 100 described herein beneficially reduces the required board mounting area, thereby facilitating an electronic device housing having a smaller footprint than a comparable non-PoP packaged system.

The thermally conductive member 130 includes at least one thermally conductive element 132 having an upper surface 136 and a lower surface 138. The upper surface 136 is thermally conductively coupled to the lower surface 152 of the second semiconductor package 150. In embodiments, the upper surface 136 of the thermally conductive member 130 is thermally conductively coupled to at least one thermally conductive member 168 (e.g., metallic land, pad, plate, or similar) disposed on the lower surface 152 of the second semiconductor package 150. The lower surface 138 is thermally conductively coupled to the upper surface 112 of the first semiconductor package 110. In embodiments, the lower surface 138 of the thermally conductive member 130 is thermally conductively coupled to at least one thermally conductive region 128 (e.g., metallic land, pad, plate, or similar) disposed on the upper surface 112 of the first semiconductor package 110.

The at least one thermally conductive element 132 in the thermally conductive member 130 may be fabricated using one or more materials or combinations of materials having a thermal conductivity greater than the thermal conductivity of the molding compound 180 used to encapsulate the second semiconductor package 150. The at least one thermally conductive element 132 may have a thermal conductivity of greater than: about 13 W/mK; about 5 W/mK; about 10 W/mK; about 15 W/mK; about 20 W/mK; about 30 W/mK; about 40 W/mK; or about 50 W/mK. In embodiments, the thermally conductive member 130 may have an overall thickness of less than: about 20 micrometers (μm); about 40 μm; about 60 μm; about 80 μm; or about 100 μm.

The at least one thermally conductive element 132 may include one or more materials, combinations of materials, and/or composite materials capable of promoting conductive heat transfer 134 from the first semiconductor package 110 to the second semiconductor package 150. Such materials may have thermal conductivity greater than the thermal conductivity of the molding compound used to at least partially encase the first semiconductor package 110. Such materials may have a thermal conductivity greater than the thermal conductivity of a molding compound 180 used to at least partially encase the second semiconductor package 150. In embodiments, the at least one thermally conductive element 132 may include one or more thermally conductive solders. In other embodiments, the at least one thermally conductive member 130 may include a dielectric core that includes one or more thermally conductive elements 132 that penetrate through the dielectric core, extending from the upper surface 136 to the lower surface 138 of the thermally conductive member 130.

In embodiments, the thermally conductive member 130 may include at least one thermally conductive element 132 fabricated using one or more metals and/or metal alloys, such as: copper, one or more copper containing alloys, tin, one or more tin containing alloys, aluminum, one or more aluminum containing alloys, and similar. In embodiments, the thermally conductive member 130 may include at least one thermally conductive element 132 fabricated using one or more non-metallic and/or composite thermally conductive materials. For example, the at least one thermally conductive element 132 may include a polymer containing one or more thermally conductive materials, carbon fiber, graphene, or similar.

The first semiconductor package 110 may include a stacked die semiconductor package that includes any number of stacked semiconductor dies 120A-120n (collectively, "semiconductor dies 120"). As depicted in FIG. 1, the first semiconductor package 110 includes a first semiconductor die 120A and a second semiconductor die 120B. In some embodiments, the first semiconductor package 110 may include a stacked die semiconductor package in which the top or uppermost semiconductor die 120n is at least partially exposed, i.e., an exposed die semiconductor package. In some embodiments, the first semiconductor package 110 may be thinned to accommodate the thickness of the thermally conductive member 130 to minimize the impact on the z-height of the completed PoP semiconductor package 100.

In embodiments, the first semiconductor package 110 may include one or more thermally conductive regions 128 disposed in, on, across, or about the upper surface 112. For example, the first semiconductor package 110 may include a metallized layer that provides a thermally conductive region 128 on the upper surface 112 of the first semiconductor package 110. In embodiments, the one or more thermally conductive regions 128 are not conductively coupled to a circuit or other electronic or semiconductor components and are included to more evenly distribute heat across the upper surface 112 of the first semiconductor package 110. In embodiments, the one or more thermally conductive regions 128 may include one or more metallized layers or regions that are communicably coupled to one or more circuits or other electronic or semiconductor components disposed in, on, or about the first semiconductor package 110.

In embodiments, the first semiconductor package 110 may be thinned by less than: about 10 micrometers (μm); about 30 μm; about 50 μm; about 70 μm; or about 90 μm to accommodate the disposal of the thermally conductive member 130 between the first semiconductor package 110 and the second semiconductor package 150. The first semiconductor package 110 includes a substrate 118 having any number of layers that include one or more conductive traces 114 on which the semiconductor dies 120 are physically mounted and to which at least some of the semiconductor dies 120 are communicably and conductively coupled.

The second semiconductor package 150 may also include a stacked die semiconductor package that includes any number of stacked semiconductor dies 160A-160*n* (collectively, "semiconductor dies 160"). As depicted in FIG. 1, the second semiconductor package 150 includes a first semiconductor die 160A stacked with a second semiconductor die 160B. A plurality of conductors 164 (wire bonds, solder bumps, etc.) connect the first semiconductor die 160A to thermally conductive pads 154 disposed on the substrate 158 of the second semiconductor package 150. Similarly, a plurality of conductors 166 (wire bonds, solder bumps, etc.) communicably couple the second semiconductor die 160B to thermally conductive pads 154 disposed on the substrate 158 of the second semiconductor package 150. In embodiments, the second semiconductor package 150 may be partially or completely encapsulated in molding compound 180. Although depicted as an overmolded semiconductor package in FIG. 1, in embodiments, the second semiconductor package 150 may also include an exposed die semiconductor package in which the second semiconductor die 160B forms at least a portion of the upper surface of the second semiconductor package 150.

In embodiments, the second semiconductor package 150 may include one or more thermally conductive regions 168 disposed in, on, across, or about the lower surface 152. In embodiments, the one or more thermally conductive regions 168 are not conductively coupled to a circuit or other electronic or semiconductor components included in the second semiconductor package 150, and are included to more evenly distribute heat across the upper surface 112 of the first semiconductor package 110 and/or across the lower surface 152 of the second semiconductor package 150. In embodiments, the one or more thermally conductive regions 168 may include one or more metallized layers or regions that are communicably coupled to one or more circuits or other electronic or semiconductor components disposed in, on, or about the second semiconductor package 150.

The thermally conductive member 130 thermally conductively couples the upper surface 112 of the first semiconductor package 110 to the lower surface 152 of the second semiconductor package 150. As depicted in FIG. 1, the thermally conductive member 130 may include at least one thermally conductive element, fixture, appliance, and/or device 132 having a thermal conductivity that promotes the conductive flow 134 of thermal energy (i.e., heat) from the first semiconductor package 110 the second semiconductor package 150. In embodiments, the lower surface 138 of the thermally conductive element, fixture, appliance, and/or device 132 thermally conductively couples to a thermally conductive region 128 on the upper surface 112 of the first semiconductor package 110. The upper surface 136 of the thermally conductive element, fixture, appliance, and/or device 132 thermally conductively couples to a thermally conductive region 168 on the lower surface 152 of the second semiconductor package 150.

In embodiments, a plurality of solder balls 144 may be conductively coupled to a respective plurality of pads 142 disposed in, on, or about the first semiconductor package substrate 118 and a plurality of solder balls 156 may be conductively coupled to on a respective plurality of conductive pads 154 disposed in, on, or about the second semiconductor package substrate 158. In embodiments, the first semiconductor package 110 and the second semiconductor package 150 may be communicably coupled using the solder balls 144 and 156. For example, the first semiconductor package 110 and the second semiconductor package 150 may be communicably coupled by melting the solder balls 144 and 156 using a reflow process. After coupling the first semiconductor package 110 to the second semiconductor package 150, the thermally conductive member 130 fills the gap between the upper surface 112 of the first semiconductor package 110 and the lower surface 152 of the second semiconductor package 150.

Left unfilled, the air-filled space or gap between the first semiconductor package 110 and the second semiconductor package 150 adversely impacts the flow of heat (i.e., the heat transfer) from the first semiconductor package 110 to the second semiconductor package 150. Disposing the thermally conductive member 130 in the gap between the first semiconductor package 110 and the second semiconductor package 150 thermally conductively couples the first semiconductor package 110 to the second semiconductor package 150, improving heat flow from the first semiconductor package 110 to the second semiconductor package 150. In addition, the thermally conductive member 130 beneficially improves heat distribution across the upper surface 122 of the first semiconductor package 110 reducing the temperature of any hot spots on the supper surface of the first semiconductor package 110. In embodiments, the thermally conductive member 130 may have a higher thermal conductivity than the molding compound 180 used to encapsulate the second semiconductor package 150 to further enhance the heat transfer from the first semiconductor package 110 and the heat distribution across the upper surface 122 of the first semiconductor package 110.

The first semiconductor package 110 may include any number and/or combination of semiconductor dies 120A-120*n*. In embodiments, the semiconductor dies 120 forming the first semiconductor package 110 may include: a system-in-a-package (SiP); a system-on-a-chip (SoC); an application specific integrated circuit (ASIC); a reduced instruction set computer (RISC); a digital signal processor (DSP); a programmable gate array (PGA); or any other device, collection of devices and/or system capable of executing machine readable instructions and accessing one or more storage devices. The first semiconductor package 110 may have any physical size, shape or configuration.

As depicted in FIG. 1, in embodiments, the first semiconductor package 110 may be fabricated using an exposed die molding process in which the semiconductor dies 120 are surrounded by a molding compound 140. In such an embodiment, the uppermost semiconductor die 120n remains at least partially exposed after curing the molding compound 140. In such embodiments, the exposed die forms a portion of the upper surface 122 of the first semiconductor package 110.

The second semiconductor package 150 may include any number and/or combination of semiconductor dies 160A-160n. In embodiments, the semiconductor dies 160 forming the second semiconductor package 150 may include, but is not limited to: a low power double data rate (LPDDR1, LPDDR2, LPDDR3, LPDDR4) random access memory; a low power standard data rate (LPSDR) random access memory; a 3D NAND; a universal flash storage (UFS) memory; an embedded multi-media controller (e.MMC); or combinations thereof. The second semiconductor package 150 may have any physical size, shape, or configuration. In some embodiments, the second semiconductor package 150 may occupy a physically smaller area than the first semiconductor package 110. For example, the surface area of the lower surface 162 of the second semiconductor package 150 may be less than the surface area of the upper surface 122 of the first semiconductor package 110. The first semiconductor package 110 and the second semiconductor package 150 may be physically, communicably, and/or conductively coupled using mass reflow or thermal compression bonding. Example mass reflow techniques include, but are not limited to: forced convection; infrared radiation; vapor phase; laser; hot bar; or any combination thereof.

Figure 2A:
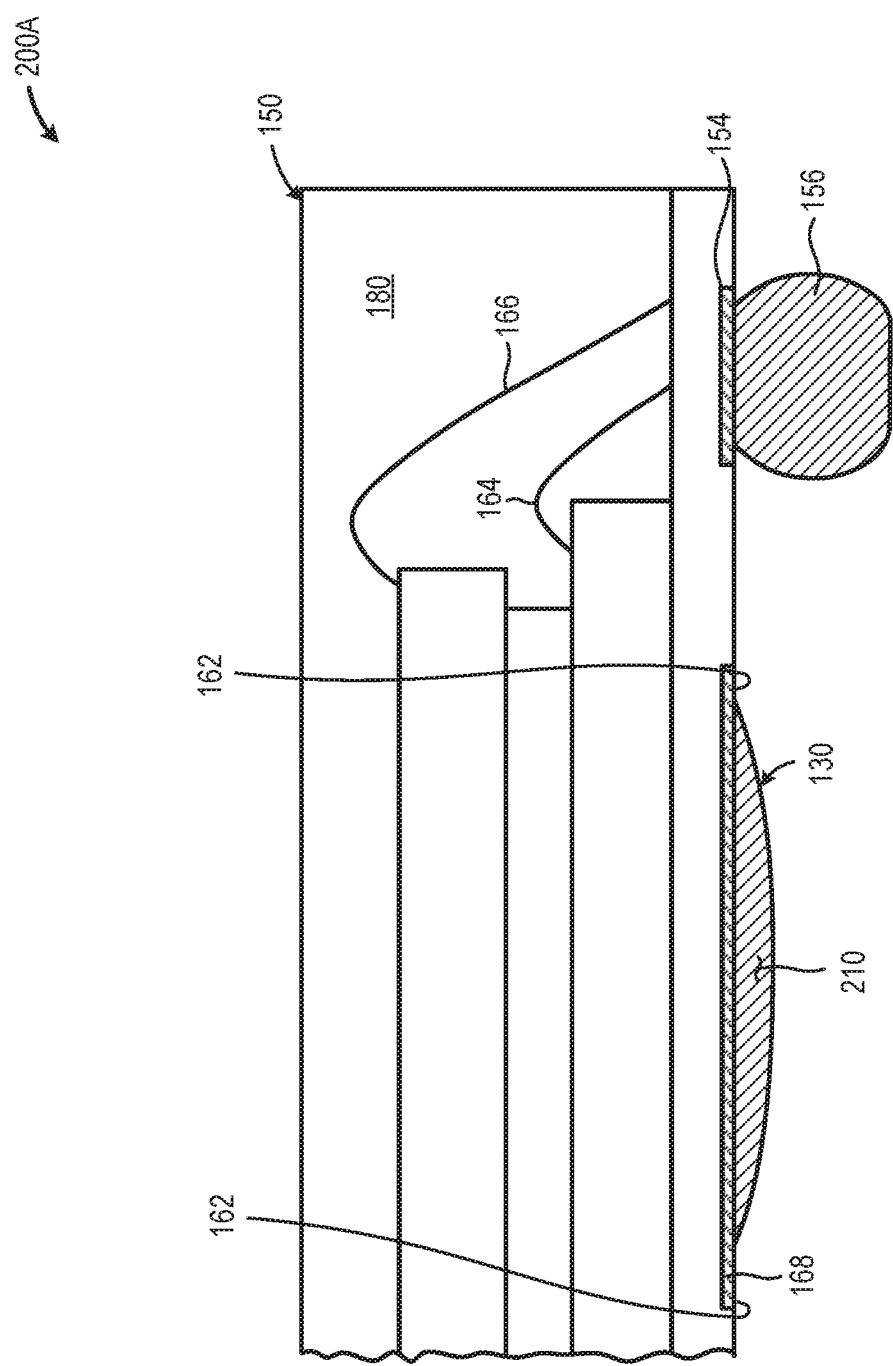
FIG. 2A is a cross-sectional elevation of an illustrative second semiconductor package that includes a thermally conductively coupled thermally conductive member in the form of a single, large, solder bump disposed proximate the thermally conductive member on the lower surface of the second semiconductor package, in accordance with at least one embodiment described herein.

FIG. 2A is a cross-sectional elevation of an illustrative second semiconductor package 150 that includes a thermally conductively coupled thermally conductive member 130 in the form of a single, large, solder bump 210 disposed proximate the thermally conductive member 168 on the lower surface 162 of the second semiconductor package 150, in accordance with at least one embodiment described herein. In embodiments, the solder bump 210 may include a solder paste containing a mixture of powdered solder and flux. In embodiments, the solder bump 210 may include any material or combination of materials having a thermal conductivity of greater than: about 35 Watts per meter-Kelvin (W/mK); about 50 W/mK; about 75 W/mK; about 100 W/mK; about 125 W/mK; or about 150 W/mK. An example solder used to form the solder bump 210 includes a lead free solder having a tin content in excess of 90% by weight (e.g., 96.5 wt %); a silver content of less than 10% by weight (e.g., 3 wt %); and a copper content of less than 3% by weight (e.g., 0.5 wt %). In embodiments, the solder bump 210 may include a solder having a reflow temperature of: about 200° C. or less; about 220° C. or less; about 240° C. or less; or about 260° C. or less.

Figure 2B:
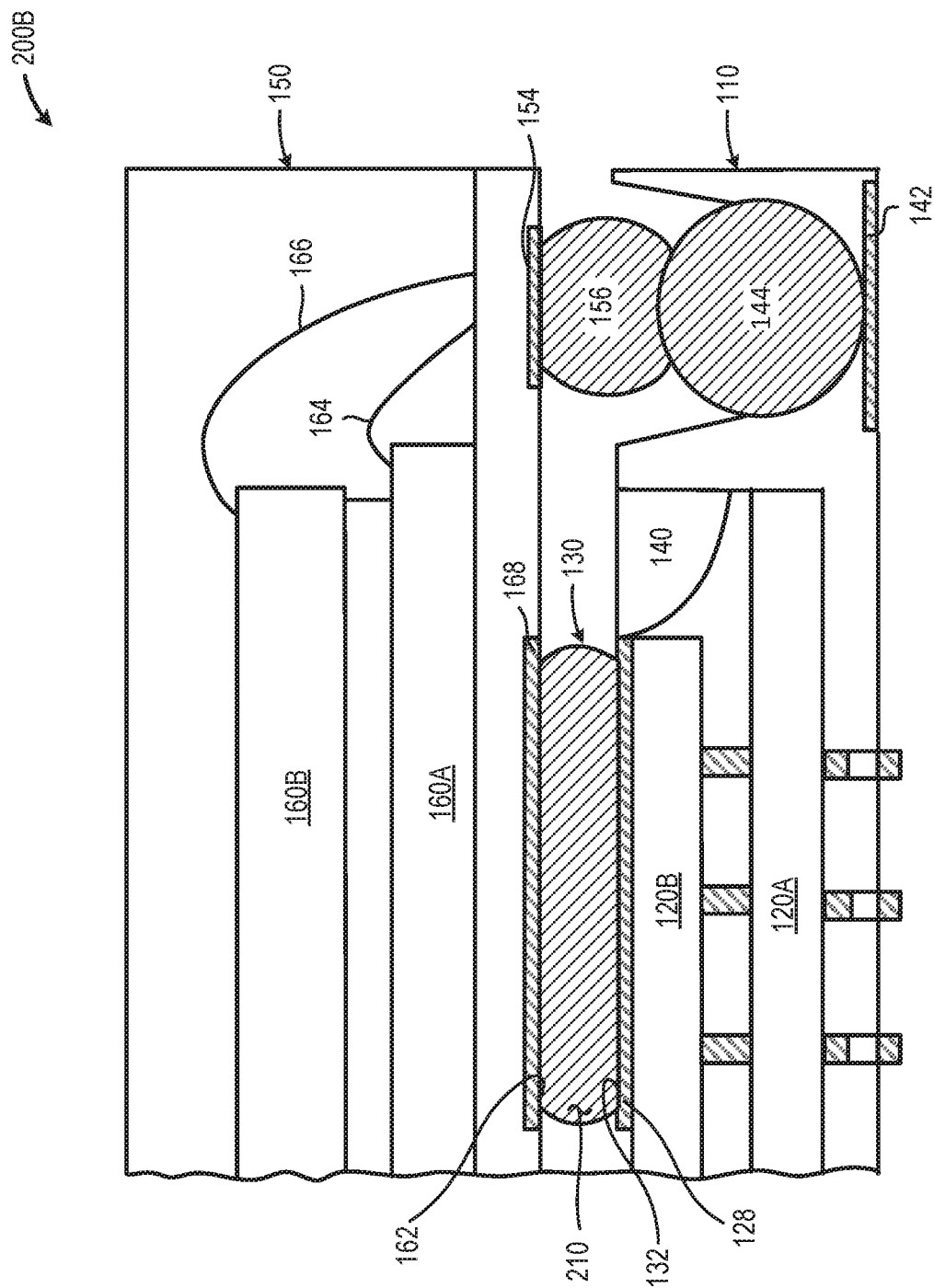
FIG. 2B is a cross-sectional elevation of an illustrative package-on-package (PoP) semiconductor package in which reflowing the at least one solder bump depicted in FIG. 2A provides or otherwise forms a thermally conductive member that thermally conductively couples a first semiconductor package to the second semiconductor package, in accordance with at least one embodiment described herein.

FIG. 2B is a cross-sectional elevation of an illustrative package-on-package (PoP) semiconductor package 200B in which reflowing the at least one solder bump 210 depicted in FIG. 2A provides or otherwise forms an thermally conductive member 130 that thermally conductively couples a first semiconductor package 110 to the second semiconductor package 150, in accordance with at least one embodiment described herein. Although only one solder bump 210 is depicted in FIGS. 2A and 2B, in embodiments, and number of solder bumps 210A-210n may be similarly thermally conductively coupled to the lower surface 152 of the second semiconductor package 150. In such embodiments, each of the number of solder bumps 210A-210n may be reflowed to provide a corresponding number of thermally conductive members 132A-132n that thermally conductively couple the first semiconductor package 110 to the second semiconductor package 150.

FIG. 3A is a cross-sectional elevation of an illustrative second semiconductor package 150 that includes a thermally conductively coupled thermally conductive member 130 in the form of a plurality of solder balls, bumps, similar structures 310A-310n (collectively, "solder balls 310"), each disposed proximate respective thermally conductive members 168A-168n (collectively, "conductive members 168") on the lower surface 162 of the second semiconductor package 150, in accordance with at least one embodiment described herein. In embodiments, each of the solder balls 310 may include a solder paste containing a mixture of powdered solder and flux. In embodiments, each of the solder balls 310 may include any material or combination of materials having a thermal conductivity of greater than: about 35 Watts per meter-Kelvin (W/mK); about 50 W/mK; about 75 W/mK; about 100 W/mK; about 125 W/mK; or about 150 W/mK. An example solder used to form each of the solder balls includes a lead free solder having a tin content in excess of 90% by weight (e.g., 96.5 wt %); a silver content of less than 10% by weight (e.g., 3 wt %); and a copper content of less than 3% by weight (e.g., 0.5 wt %). In embodiments, the solder used to form each of the solder balls may have a reflow temperature of: about 200° C. or less; about 220° C. or less; about 240° C. or less; or about 260° C. or less.

Figure 3B:
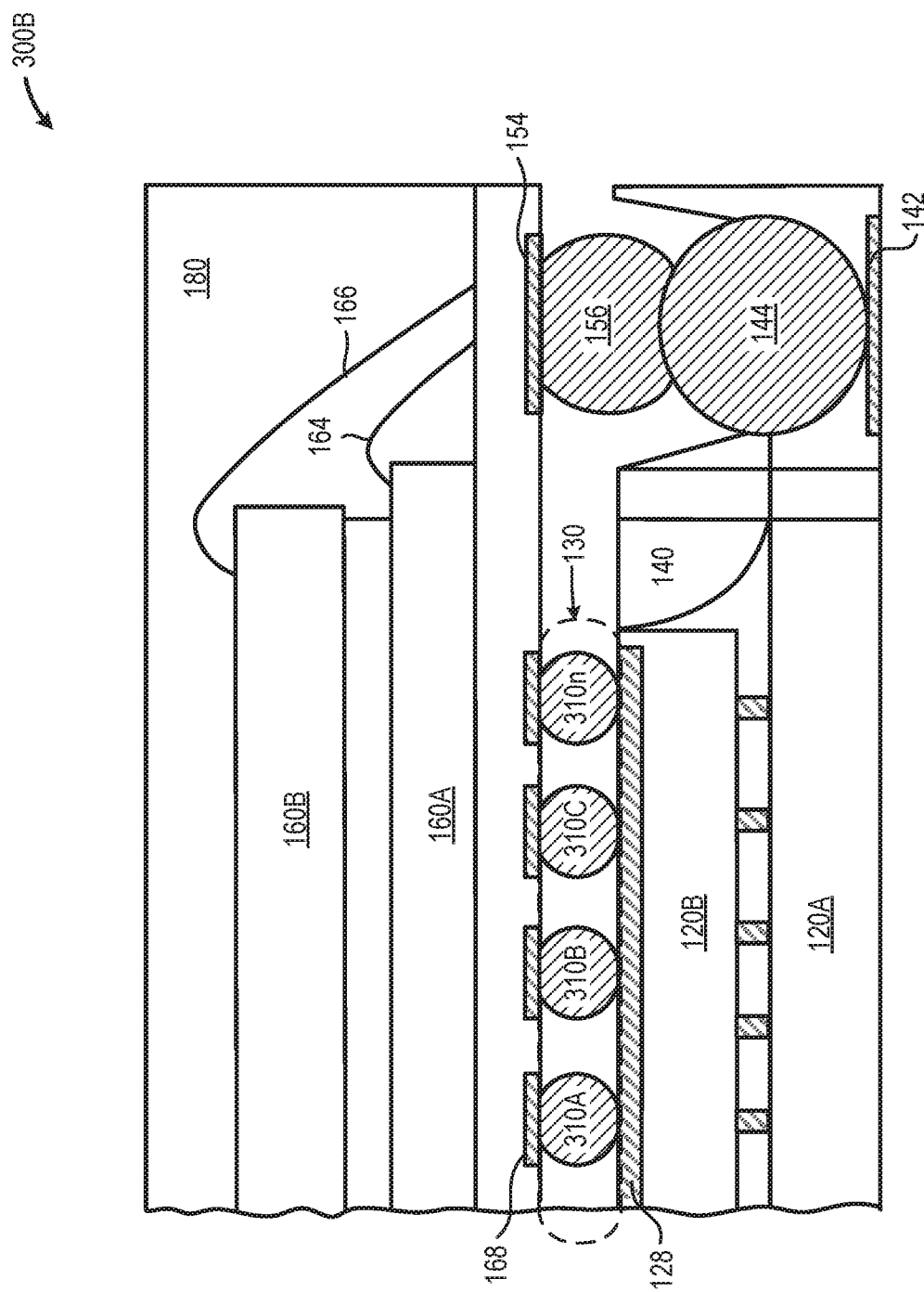
FIG. 3B is a cross-sectional elevation of an illustrative package-on-package (PoP) semiconductor package in which the second semiconductor package depicted in FIG. 3A has been thermally conductively coupled to a first semiconductor package by reflowing the plurality of solder balls to provide a corresponding plurality of thermally conductive members in a thermally conductive member that is thermally conductively couples the first semiconductor package with the second semiconductor package 150, in accordance with at least one embodiment described herein.

FIG. 3B is a cross-sectional elevation of an illustrative package-on-package (PoP) semiconductor package 300B in which the second semiconductor package 150 depicted in FIG. 3A has been thermally conductively coupled to a first semiconductor package 110 by reflowing the plurality of solder balls 310 to provide a corresponding plurality of thermally conductive members 132 in an thermally conductive member 130 that is thermally conductively couples the first semiconductor package 110 with the second semiconductor package 150, in accordance with at least one embodiment described herein.

Figure 4A:
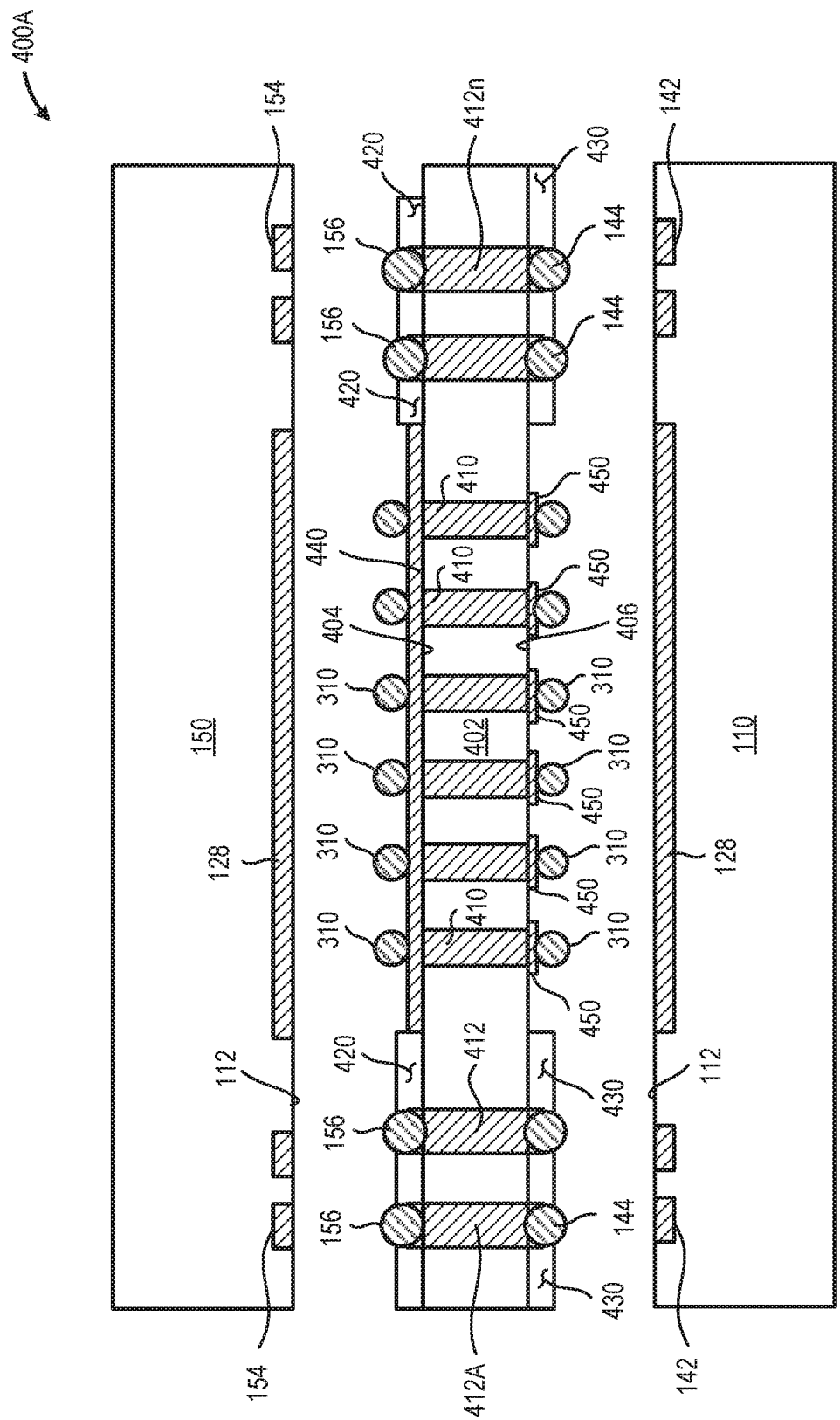
FIG. 4A is a cross-sectional elevation of an example thermally conductive member comprising a dielectric core that includes a number of thermally conductive through vias that penetrate from the upper surface of the core to the lower surface of the core and thermally conductively couple the first semiconductor package to the second semiconductor package, in accordance with at least one embodiment described herein.

FIG. 4A is a cross-sectional elevation of an example thermally conductive member in the form of an interposer layer 400 that includes a dielectric core 402 having a number of thermally conductive through vias 410A-410n (collectively "thermally conductive through vias 410") that penetrate from the upper surface 404 of the core 402 to the lower surface 406 of the core 402 and thermally conductively couple the first semiconductor package 110 to the second semiconductor package 150, in accordance with at least one embodiment described herein. In addition to the thermally conductive through vias 410, the interposer layer 400 also includes a number of electrically conductive through vias 412A-412n (collectively, "electrically conductive through vias 412") that communicably couple the first semiconductor package 110 to the second semiconductor package 150.

In embodiments, an interposer layer 400 holds the solder balls 144 and 156 used to communicably couple the first semiconductor package 110 to the second semiconductor package 150. A solder resist material 420 may be disposed on, across, or about all or a portion of the upper surface 404 of the core 402 forming the interposer layer 400 to prevent the migration of the melted solder balls 156 during the reflow process. Similarly, a solder resist material 430 may be disposed on, across, or about all or a portion of the lower surface 406 of the core 402 forming the interposer layer 400 to prevent the migration of melted solder balls 144 during the reflow process. The thermal properties of the solder resist 420 disposed on the upper surface 404 of the core 402 and disposed on the lower surface 406 of the core 402 compromise the heat transfer achievable through the interposer layer 400. The core 402 may be fabricated using one or more electrically non-conductive or electrically insulative materials, for example an organic dielectric material. The core 402 may have a thickness of less than: about 100 micrometers (μm); about 80 μm; about 60 μm; about 40 μm; or about 20 μm.

To improve the thermal properties of the interposer layer 400, the solder resist 420 may be selectively removed or otherwise stripped from the portions of the upper surface 404 of the interposer layer 400 in regions where the solder balls 156 communicably couple the second semiconductor package 150 to the interposer layer 400 are absent. Similarly, the solder resist 430 may be selectively removed or otherwise stripped from the portions of the lower surface 406 of the interposer layer 400 in regions where the solder balls 144 communicably couple the first semiconductor package 110 to the interposer layer 400 are absent. In addition, the thermal transfer properties of the interposer layer 400 may be further enhanced using a plurality of thermally conductive through vias 410 that extend from the upper surface 404 to the lower surface 406 of the core 402. The thermally conductive through vias 410 are formed using one or more materials having a thermal conductivity that exceeds the thermal conductivity of the core 402 and/or the molding compound disposed about the first semiconductor package 110 and/or the second semiconductor package 150.

In embodiments, a thermally conductive coating or layer 440 may be deposited or otherwise disposed across at least a portion of the upper surface 404 of the core 402. The thermally conductive coating or layer 440 may be deposited using any currently available or future developed deposition method or technique. Example deposition techniques include photolithographic deposition or electrolytic deposition. The thermally conductive layer 440 may be coupled to at least some of the thermally conductive through vias 410. The presence of the thermally conductive coating or layer 440 beneficially aids in the distribution of heat across (i.e., in the x-y direction) the surface of the interposer layer 400 and limits the thermal gradient that occurs at hot spots or similar elevated temperature regions of the first semiconductor package 110. Solder balls or bumps 310 may be disposed evenly (e.g., in a regular pattern) or unevenly (e.g., in an irregular pattern) across the surface of the thermally conductive layer 440 to thermally and physically couple the interposer layer 400 to the lower surface 152 of the second semiconductor package 150.

The thermally conductive layer 440 may include one or more thermally conductive metals, metal alloys, composites, or polymers. For example, the thermally conductive layer 440 may include a copper or copper alloy layer disposed on, in, about, or across all or a portion of the upper surface 404 of the core 402. In some implementations, the thermally conductive layer may have a thickness of less than about: 10 micrometers (μm); about 15 μm; about 20 μm; about 25 μm; or about 30 μm. In embodiments, the thermally conductive layer 440 may have a thermal conductivity of greater than: about 50 Watts per meter-Kelvin (W/mK); about 100 W/mK; about 150 W/mK; about 200 W/mK; about 250 W/mK; about 300 W/mK; about 350 W/mK; or about 400 W/mK.

Although not depicted in FIG. 4A, in some implementations, a second thermally conductive layer or coating may be disposed on, in, about, or across at least a portion of the thermally conductive coating or layer 440. In embodiments, the second thermally conductive layer may improve one or more parameters of the underlying thermally conductive coating or layer 440. For example, the second thermally conductive layer may improve the solder wettability of the thermally conductive coating or layer 440. The second thermally conductive layer may include one or more materials or combination of materials having a thermal conductivity that is the same as or greater than the thermal conductivity of the underlying thermally conductive coating or layer 440. For example, a thin layer of nickel/palladium/gold (NiPdAu) may be disposed in, on, about or across at least a portion of the thermally conductive coating or layer 440. In embodiments, the second thermally conductive layer may include a layer having a thickness of less than: about 30 micrometers (μm); about 25 μm; about 20 μm; about 15 μm; about 10 μm; or about 5 μm.

Although not depicted in FIG. 4A, in embodiments, a similar thermally conductive layer 440 may be alternatively or additionally deposited or otherwise disposed across at least a portion of the lower surface 406 of the core 402. In embodiments, one or more layers or coatings may be applied to all or a portion of the thermally conductive layer 440.

In embodiments, thermal elements, such as thermally conductive caps 450 may be deposited or otherwise disposed across at least a portion of the lower surface 406 of the core 402. In embodiments, the thermally conductive caps 450 may be disposed proximate some or all of the thermally conductive through vias 410 in the core 402. In some implementations, a solder bump or solder ball 310 may be disposed proximate at least some of the thermally conductive caps 450 to thermally and physically couple the interposer layer 400 to the upper surface 112 of the first semiconductor package 110. Although not depicted in FIG. 4A, in embodiments, similar thermally conductive caps 450 may be alternatively or additionally deposited or otherwise disposed proximate at least some of the thermally conductive through vias 410 on the upper surface 404 of the core 402.

The thermally conductive caps 450 may be fabricated using one or more thermally conductive metals, metal alloys, composites, or polymers. For example, the thermally conductive caps 450 may include a copper or copper alloy layer disposed on, in, about, or across all or a portion of the lower surface 406 of the core 402. In some implementations, the thermally conductive caps 450 may have a thickness of less than about: 10 micrometers (μm); about 15 μm; about 20 μm; about 25 μm; or about 30 μm. In embodiments, the thermally conductive caps 450 may have a thermal conductivity of greater than: about 50 Watts per meter-Kelvin (W/mK); about 100 W/mK; about 150 W/mK; about 200 W/mK; about 250 W/mK; about 300 W/mK; about 350 W/mK; or about 400 W/mK.

Figure 4B:
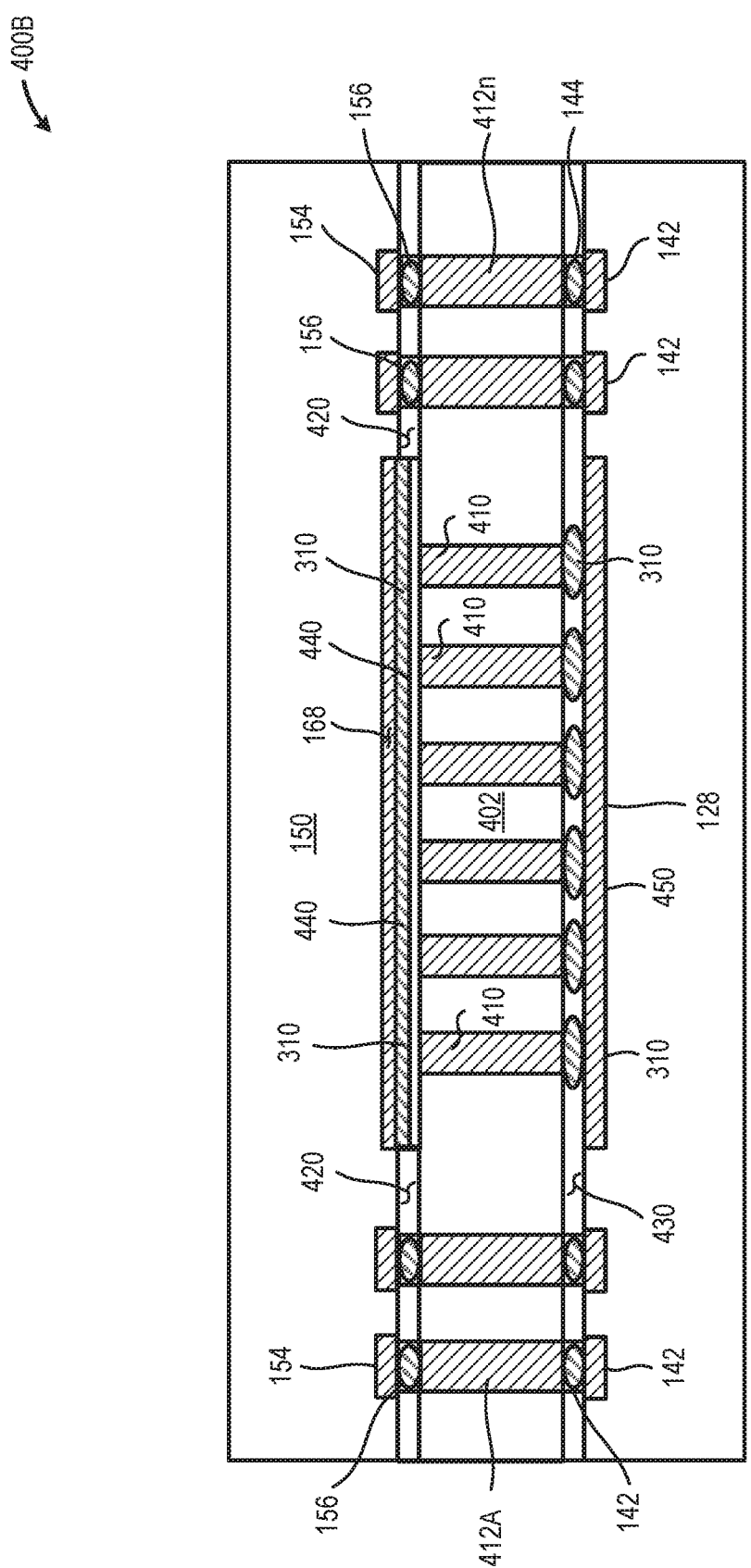
FIG. 4B is a cross-sectional elevation of an example thermally conductive member comprising a dielectric core that includes a number of thermally conductive through vias that penetrate from the upper surface of the core to the lower surface of the core after reflow and in which the thermally conductive through vias thermally conductively couple the first semiconductor package to the second semiconductor package, in accordance with at least one embodiment described herein.

FIG. 4B is a cross-sectional elevation of an example interposer layer 400 comprising a dielectric core 402 that includes a number of thermally conductive through vias 410A-410n (collectively "thermally conductive through vias 410") that penetrate from the upper surface 404 of the core 402 to the lower surface 406 of the core 402 after reflow and in which the thermally conductive through vias 410 thermally conductively couple the first semiconductor package 110 to the second semiconductor package 150, in accordance with at least one embodiment described herein. After reflow, the solder balls 310 disposed on the thermally conductive coating or layer 440 on the upper surface 404 of the core 402 thermally conductively couple the interposer layer 400 to the lower surface 152 of the second semiconductor package 150. After reflow, the solder balls 310 disposed on the thermally conductive caps 450 on the lower surface 406 of the interposer layer 400 thermally conductively couple the interposer layer 400 to the upper surface 112 of the first semiconductor package 110.

Figure 5:
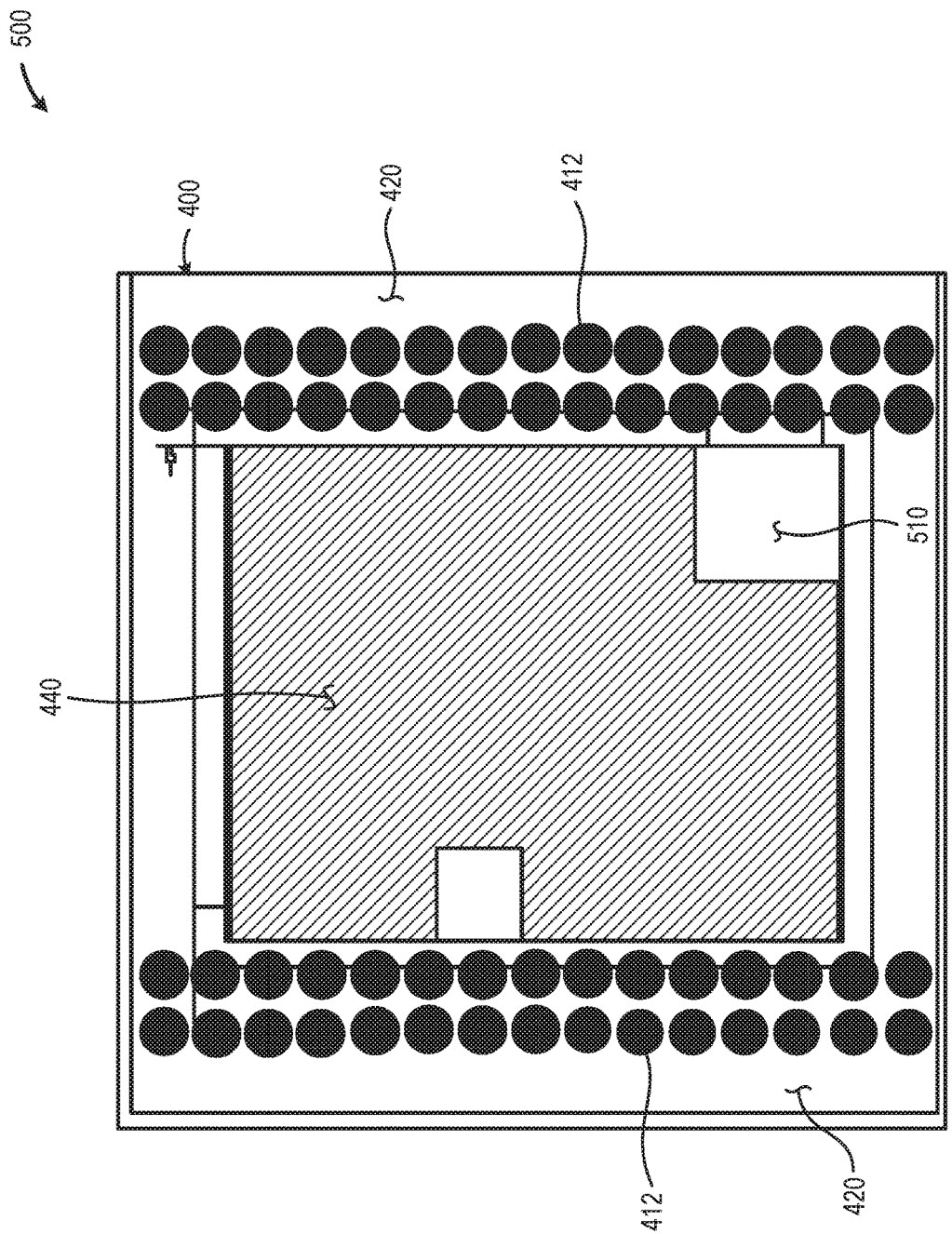
FIG. 5 is a plan view of an example thermally conductive member, such as depicted in FIG. 4, that includes a plurality of electrically conductive through vias at least partially surrounded by solder resist, the electrically conductive through vias to communicably couple a first semiconductor package to a second semiconductor package, in accordance with at least one embodiment described herein.

FIG. 5 is a plan view of an example interposer layer 400, such as depicted in FIG. 4, that includes a plurality of electrically conductive through vias 412 at least partially surrounded by solder resist 420, the electrically conductive through vias 412 to communicably couple a first semiconductor package 110 to a second semiconductor package 150, in accordance with at least one embodiment described herein. The interposer layer 400 also includes are area of exposed thermally conductive material 440 where the solder resist 420 has been selectively removed from the interposer layer 400. A portion of the solder resist 510 has been allowed to remain to permit the deposition of a machine or human readable symbol useful in the PoP semiconductor package manufacturing process.

Figure 6:
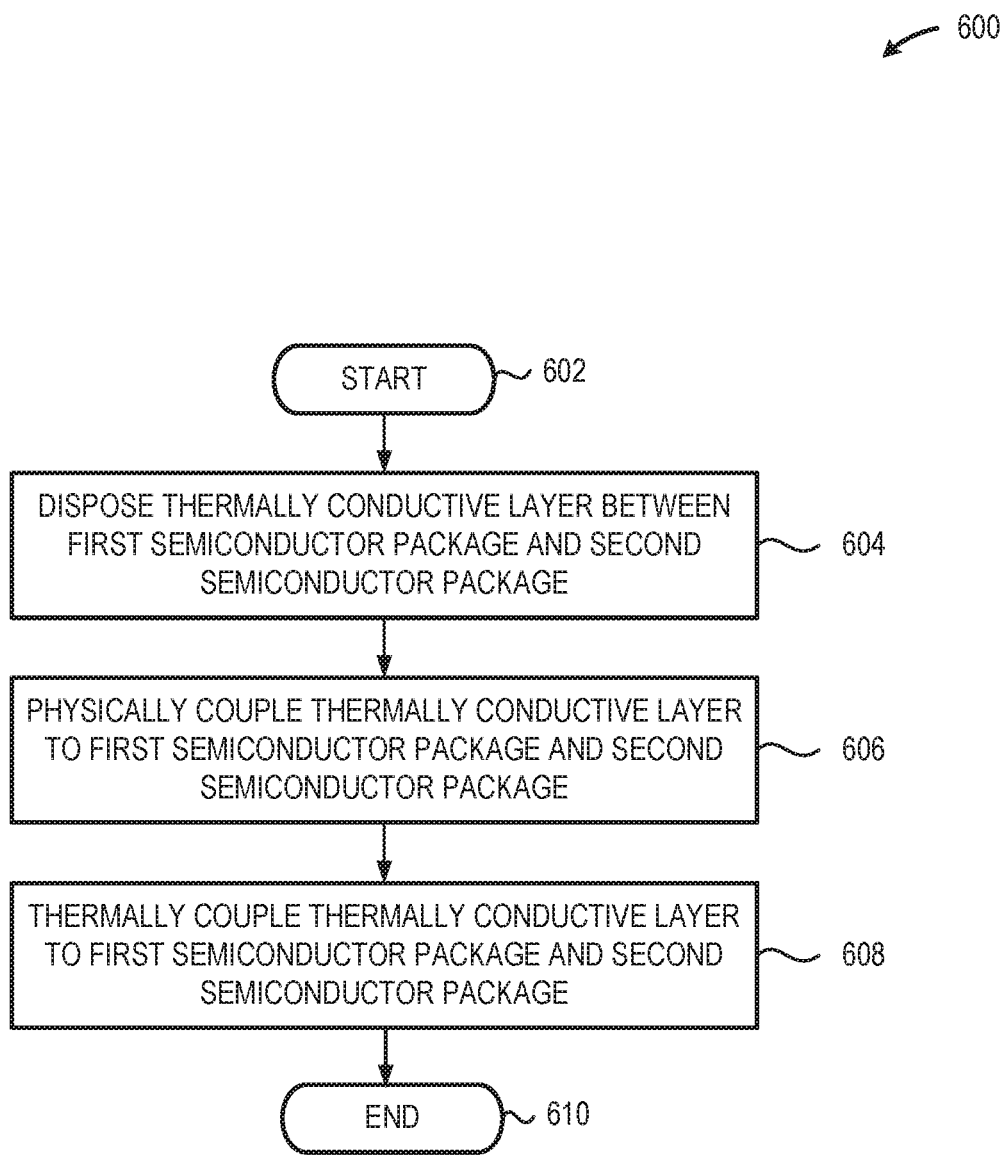
FIG. 6 is a high-level logic flow diagram of an illustrative package-on-package semiconductor package fabrication method, in accordance with at least one embodiment described herein.

FIG. 6 is a high-level logic flow diagram of an illustrative package-on-package semiconductor package fabrication method 600, in accordance with at least one embodiment described herein. In embodiments, a thermally conductive member 130 may be disposed between the first semiconductor package 110 and the second semiconductor package 150. The thermally conductive member 130 thermally conductively couples the first semiconductor package 110 to the second semiconductor package 150, thereby facilitating the flow of thermal energy 134 from the first semiconductor package 110 to the second semiconductor package 150 and to the ambient environment surrounding the PoP semiconductor package 100. In embodiments, the thermally conductive member 130 may include an interposer layer 400 having a number of electrically conductive through vias 412 that communicably couple the first semiconductor package 110 to the second semiconductor package 150. The thermally conductive member 130 may thermally conductively couple the first semiconductor package 110 top the second semiconductor package 150 using at least one of: a single thermally conductive element 210; multiple thermally conductive elements 310; and/or an interposer layer 400 having a plurality of thermally conductive through vias 410 that thermally conductively couple the first semiconductor package 110 to the second semiconductor package and a number of electrically conductive through vias 412 that communicably couple the first semiconductor package 110 to the second semiconductor package 150. The method 600 commences at 602.

At 604, an thermally conductive member 130 is disposed between a first semiconductor package 110 and a second semiconductor package 150. In embodiments, the thermally conductive member 130 may include a solder bump 210 coupled to the lower surface 152 of the second semiconductor package 150. In such embodiments, when the second semiconductor package 150 is disposed proximate the first semiconductor package 110, the solder bump 210 is positioned between the first semiconductor package 110 and the second semiconductor package 150. In other embodiments, the thermally conductive member 130 may include a plurality of solder bumps or solder balls 310 may be coupled to the lower surface 152 of the second semiconductor package 150. In such embodiments, when the second semiconductor package 150 is disposed proximate the first semiconductor package 110, the plurality of solder bumps 310 are positioned between the first semiconductor package 110 and the second semiconductor package 150. In yet other embodiments, the thermally conductive member 130 may include an interposer layer 400 having a core 402 that includes a plurality of thermally conductive through vias 410 extending from an upper surface 404 to the lower surface 406 of the core 402. When inserted between the first semiconductor package 110 and the second semiconductor package 150, the thermally conductive through vias 410 extend from the upper surface 112 of the first semiconductor package 110 to the lower surface 152 of the second semiconductor package 150.

At 606, the thermally conductive member physically couples to the upper surface 112 of the first semiconductor package 110 and to the lower surface 152 of the second semiconductor package 150. In embodiments, the upper surface 112 of the first semiconductor package 110 may include one or more metallized layers 128 and the lower surface 152 of the second semiconductor package 150 may include one or more thermally conductive regions 168. In embodiments, during reflow, the solder bump 210 flows and physically couples to the one or more metallized layers 128 disposed on the upper surface 112 of the first semiconductor package 110 and to the one or more thermally conductive regions 168 disposed on the lower surface 152 of the second semiconductor package 150. In other embodiments, during reflow, the plurality of solder bumps 310 flow and physically couple to the one or more metallized layers 128 disposed on the upper surface 112 of the first semiconductor package 110 and to the one or more thermally conductive regions 168 disposed on the lower surface 152 of the second semiconductor package 150. In yet other embodiments, solder balls 310 may be disposed on the upper surface 404 and the lower surface 406 of an thermally conductive member 130. During reflow, the solder balls 310 flow and physically couple to the one or more metallized layers 128 disposed on the upper surface 112 of the first semiconductor package 110 and to the one or more thermally conductive regions 168 disposed on the lower surface 152 of the second semiconductor package 150.

At 606, the thermally conductive member 130 thermally conductively couples to the upper surface 112 of the first semiconductor package 110 and to the lower surface 152 of the second semiconductor package 150. Thermally conductively coupling the thermally conductive member 130 to the upper surface 112 of the first semiconductor package 110 and to the lower surface 152 of the second semiconductor package 150 facilitates the flow of thermal energy 134 from the first semiconductor package 110 to the second semiconductor package 150 via the thermally conductive member 130. The method 600 concludes at 608.

While FIG. 6 illustrates various operations according to one or more embodiments, it is to be understood that not all of the operations depicted in FIG. 6 are necessary for other embodiments. Indeed, it is fully contemplated herein that in other embodiments of the present disclosure, the operations depicted in FIG. 6, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

Thus, the present disclosure is directed to systems and methods for improving heat distribution and heat removal efficiency in PoP semiconductor packages. A PoP semiconductor package includes a first semiconductor package that is physically, communicably, and conductively coupled to a stacked second semiconductor package. A thermally conductive member that includes at least one thermally conductive member may be disposed between the first semiconductor package and the second semiconductor package. The thermally conductive member may include: a single thermally conductive element; multiple thermally conductive elements; or a core that includes at least one thermally conductive element. The thermally conductive elements are thermally conductively coupled to an upper surface of the first semiconductor package and to the lower surface of the second semiconductor package to facilitate the transfer of heat from the first semiconductor package to the second semiconductor package.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for improving and enhancing lateral heat distribution across the upper surface of a first semiconductor package in a PoP semiconductor package and improving and enhancing the flow of heat from a first semiconductor package to a second semiconductor package within a PoP semiconductor package.

According to example 1, there is provided a package-on-package (PoP) semiconductor package. The PoP semiconductor package may include: a first semiconductor package having an upper surface and a lower surface; a second semiconductor package having an upper surface and a lower surface; and an thermally conductive member disposed between the upper surface of the first semiconductor package and the lower surface of the second semiconductor package, the thermally conductive member including at least one continuous metallic, thermally conductive pathway between the upper surface of the first semiconductor package and the lower surface of the second semiconductor package.

Example 2 may include elements of example 1 where the upper surface of the first semiconductor package may include a metallized die backside; the lower surface of the second semiconductor package may include at least one thermally conductive region; and the thermally conductive member may include at least one thermally conductive element thermally conductively coupled to at least a portion of the metallized die backside and at least a portion of the thermally conductive region disposed on the lower surface of the second semiconductor package.

Example 3 may include elements of example 2 where the at least one conductive element may include a uniform layer of thermally conductive material disposed between and thermally conductively coupled to at least a portion of the metallized die backside and at least a portion of the at least one thermally conductive region disposed on the lower surface of the second semiconductor package.

Example 4 may include elements of example 3 where the uniform layer of thermally conductive material may include a uniform layer of solder reflowed between the metallized die backside and the at least one thermally conductive region.

Example 5 may include elements of example 2 where the at least one conductive element may include a plurality of thermally conductive elements, each formed from a thermally conductive material disposed between and thermally conductively coupled to at least a portion of the metallized die backside of the first semiconductor package and at least a portion of the at least one thermally conductive region disposed on the lower surface of the second semiconductor package.

Example 6 may include elements of example 5 where the plurality of thermally conductive elements may include a plurality of solder pieces, each of the plurality of solder pieces reflowed between the metallized die backside and a respective one of the at least one thermally conductive regions.

Example 7 may include elements of example 2 where the metallized portion of the upper surface of the first semiconductor package may include a metallization layer that includes at least one of: copper, a copper alloy, gold, a gold alloy, or solder.

Example 8 may include elements of example 2 where the metallized portion of the upper surface of the first semiconductor package may include a metallization layer that includes at least one of: a sinterable paste material or a thermally conductive adhesive.

Example 9 may include elements of example 1 where the thermally conductive member comprises an interposer layer that includes: a dielectric core material having an upper surface and a lower surface; a plurality of thermally conductive through vias extending continuously from the upper surface of the core material to the lower surface of the core material, the plurality of thermally conductive through vias to thermally conductively couple the upper surface of the first semiconductor package to the lower surface of the second semiconductor package; and a plurality of electrically conductive through vias extending continuously from the upper surface of the core material to the lower surface of the core material, the plurality of electrically conductive through vias to electrically conductively couple the first semiconductor package to the second semiconductor package.

Example 10 may include elements of example 9 where the plurality of thermally conductive through vias may include thermally conductive through vias containing at least one of: copper or a copper containing alloy.

Example 11 may include elements of example 9 where each of the plurality of thermally conductive through vias may include a thermally conductive through via having a diameter of from 30 micrometers (µm) to 100 µm; and where the plurality of thermally conductive through vias may include thermally conductive through vias disposed a pitch of from about 100 micrometers (µm) to about 500 µm.

Example 12 may include elements of example 9 where the plurality of thermally conductive through vias may include at least one thermally conductive through via disposed proximate an area of the upper surface of the first semiconductor package that, in operation, attains an elevated temperature.

Example 13 may include elements of example 12 where the interposer layer further comprises a metallized layer disposed across at least a portion of the upper surface of the interposer layer, the metallized layer disposed across at least a portion of the plurality of thermally conductive through vias.

Example 14 may include elements of example 13 where the interposer layer further comprises a plurality of pads disposed on the lower surface of the interposer layer, each of the plurality of pads disposed proximate a respective one of the plurality of thermally conductive through vias.

Example 15 may include elements of example 14 where each of the plurality of pads may include a pad having a diameter of from about 70 micrometers (μm) to 150 μm.

Example 16 may include elements of example 13 where the metallized layer may include a metallized layer containing at least one of: copper, a copper containing alloy, gold, a gold containing alloy, or a thermally conductive solder.

Example 17 may include elements of example 16 where the metallized layer may include a metallized layer having a thickness of from 5 micrometers (μm) to 25 μm.

Example 18 may include elements of example 13 where the interposer layer may further include: a first solder resist layer disposed on the upper surface of the core material between at least some of the plurality of thermally conductive through vias and at least some of the plurality of electrically conductive through vias; and a second solder resist layer disposed on the lower surface of the core material between at least some of the plurality of thermally conductive through vias and at least some of the plurality of electrically conductive through vias.

According to example 19, there is provided a package-on-package (PoP) semiconductor package fabrication method. The method may include: disposing an thermally conductive member between an upper surface of a first semiconductor package and a lower surface of a second semiconductor package; wherein the thermally conductive member includes at least one continuous metallic, thermally conductive, member; physically coupling the thermally conductive member to the upper surface of the first semiconductor package and the lower surface of the second semiconductor package; and thermally conductively coupling the thermally conductive member to the upper surface of the first semiconductor package and the lower surface of the second semiconductor package.

Example 20 may include elements of example 19 where disposing a thermally conductive member between an upper surface of a first semiconductor package and a lower surface of a second semiconductor package may include: disposing an thermally conductive member between an upper surface of a first semiconductor package that includes a metallized die backside and a lower surface of the second semiconductor package that includes at least one thermally conductive region.

Example 21 may include elements of example 20 where thermally conductively coupling the thermally conductive member to the upper surface of the first semiconductor package and the lower surface of the second semiconductor package may include: thermally conductively coupling at least one conductive element included in the thermally conductive member to at least a portion of the metallized die backside disposed on the upper surface of the first semiconductor package and at least a portion of the thermally conductive region disposed on the lower surface of the second semiconductor package.

Example 22 may include elements of example 21 where thermally conductively coupling at least one conductive element included in the thermally conductive member to at least a portion of the metallized die backside disposed on the upper surface of the first semiconductor package and at least a portion of the thermally conductive region disposed on the lower surface of the second semiconductor package may include: thermally conductively coupling a uniform layer of thermally conductive material between at least a portion of the metallized die backside disposed on the upper surface of the first semiconductor package and at least a portion of the at least one thermally conductive region disposed on the lower surface of the second semiconductor package.

Example 23 may include elements of example 22 where thermally conductively coupling a uniform layer of thermally conductive material between at least a portion of the metallized die backside disposed on the upper surface of the first semiconductor package and at least a portion of the at least one thermally conductive region disposed on the lower surface of the second semiconductor package may include: reflowing a uniform layer of solder between at least a portion of the metallized die backside disposed on the upper surface of the first semiconductor package and at least a portion of the at least one thermally conductive region disposed on the lower surface of the second semiconductor package.

Example 24 may include elements of example 21 where thermally conductively coupling at least one conductive element included in the thermally conductive member to at least a portion of the metallized die backside disposed on the upper surface of the first semiconductor package and at least a portion of the thermally conductive region disposed on the lower surface of the second semiconductor package may include: thermally conductively coupling each of a plurality of thermally conductive elements, each formed from a thermally conductive material to at least a portion of the metallized die backside of the first semiconductor package and at least a portion of the at least one thermally conductive region disposed on the lower surface of the second semiconductor package.

Example 25 may include elements of example 24 where thermally conductively coupling each of a plurality of thermally conductive elements, each formed from a thermally conductive material to at least a portion of the metallized die backside of the first semiconductor package and at least a portion of the at least one thermally conductive region disposed on the lower surface of the second semiconductor package may include: reflowing each of a plurality of solder pieces between the metallized die backside disposed on the upper surface of the first semiconductor package and at least a portion of the at least one thermally conductive region disposed on the lower surface of the second semiconductor package.

Example 26 may include elements of example 20 where disposing an thermally conductive member between an upper surface of a first semiconductor package that includes a metallized die backside and a lower surface of the second semiconductor package that includes at least one thermally conductive region may include: disposing an thermally conductive member between an upper surface of a first semiconductor package that includes a metallized die backside that includes as metallized layer containing at least one of: copper, a copper alloy, gold, a gold alloy, or solder.

Example 27 may include elements of example 20 where disposing an thermally conductive member between an upper surface of a first semiconductor package that includes a metallized die backside and a lower surface of the second semiconductor package that includes at least one thermally conductive region may include: disposing an thermally conductive member between an upper surface of a first semiconductor package that includes a metallized die backside that includes as metallized layer containing at least one of: a sinterable paste material or a thermally conductive adhesive.

Example 28 may include elements of example 20 where disposing an thermally conductive member between an upper surface of a first semiconductor package that includes a metallized die backside and a lower surface of the second semiconductor package that includes at least one thermally conductive region may include: thermally conductively coupling an interposer layer that includes a plurality of thermally conductive through vias to the upper surface of the first semiconductor package and to the lower surface of the second semiconductor package, each of the plurality of thermally conductive through vias extending continuously from an upper surface of a core material to the lower surface of the core material; and communicably coupling a plurality of electrically conductive through vias between the first semiconductor package and the second semiconductor package, each of the plurality of electrically conductive through vias extending continuously from the upper surface of the core material to the lower surface of the core material.

Example 29 may include elements of example 28 where thermally conductively coupling a plurality of thermally conductive through vias to the upper surface of the first semiconductor package and to the lower surface of the second semiconductor package may include: thermally conductively coupling a plurality of thermally conductive through vias that contain at least one of: copper or a copper containing alloy to the upper surface of the first semiconductor package and to the lower surface of the second semiconductor package.

Example 30 may include elements of example 29 where thermally conductively coupling a plurality of thermally conductive through vias to the upper surface of the first semiconductor package and to the lower surface of the second semiconductor package may include: thermally conductively coupling a plurality of thermally conductive through vias having a diameter of from 30 micrometers (μm) to 100 μm on a pitch of from about 100 μm to about 500 μm between the upper surface of the first semiconductor package and the lower surface of the second semiconductor package.

Example 31 may include elements of example 29 where thermally conductively coupling a plurality of thermally conductive through vias to the upper surface of the first semiconductor package and to the lower surface of the second semiconductor package may include: disposing a metallized layer on at least a portion of the upper surface of the thermally conductive member; thermally conductively coupling the metallized layer to at least some of each of the plurality of thermally conductive through vias; and thermally conductively coupling the metallized layer to the lower surface of the second semiconductor package.

Example 32 may include elements of example 31 where thermally conductively coupling a plurality of thermally conductive through vias to the upper surface of the first semiconductor package and to the lower surface of the second semiconductor package may include: disposing a plurality of thermally conductive pads on the lower surface of the thermally conductive member; thermally conductively coupling each of the plurality of thermally conductive pads top a respective one of the plurality of thermally conductive through vias; and thermally conductively coupling each of at least some of the plurality of thermally conductive pads to the upper surface of the first semiconductor package.

Example 33 may include elements of example 32 where disposing a plurality of thermally conductive pads on the lower surface of the thermally conductive member may include: disposing a plurality of conductive pads having a diameter of from about 70 micrometers (μm) to 150 μm on the lower surface of the thermally conductive member.

Example 34 may include elements of example 33 where disposing a metallized layer on at least a portion of the upper surface of the thermally conductive member may include: disposing a metallized layer containing at least one of: copper, a copper containing alloy, gold, a gold containing alloy, or a thermally conductive solder on at least a portion of the upper surface of the thermally conductive member.

Example 35 may include elements of example 34 where disposing a metallized layer on at least a portion of the upper surface of the thermally conductive member may further include: disposing a metallized layer having a thickness of from 5 micrometers (μm) to 25 μm on at least a portion of the upper surface of the thermally conductive member.

Example 36 may include elements of example 28 where disposing an thermally conductive member between an upper surface of a first semiconductor package and a lower surface of a second semiconductor package; wherein the thermally conductive member includes at least one continuous metallic, thermally conductive, member may include: disposing an thermally conductive member between an upper surface of a first semiconductor package and a lower surface of a second semiconductor package; wherein the thermally conductive member includes at least one continuous metallic, thermally conductive, member, the thermally conductive member may include: a first solder resist layer disposed on the upper surface of the thermally conductive member between at least some of the plurality of thermally conductive through vias and at least some of the plurality of electrically conductive through vias; and a second solder resist layer disposed on the lower surface of the thermally conductive member between at least some of the first plurality of metallic through vias and at least some of the second plurality of metallic through vias.

According to example 37, there is provided an electronic device. The electronic device may include: a package-on-package (PoP) semiconductor package that includes: a first semiconductor package having an upper surface and a lower surface; a second semiconductor package having an upper surface and a lower surface; and an thermally conductive member disposed between the upper surface of the first semiconductor package and the lower surface of the second semiconductor package, the thermally conductive member including at least one continuous metallic, thermally conductive pathway between the upper surface of the first semiconductor package and the lower surface of the second semiconductor package.

Example 38 may include elements of example 37 where the upper surface of the first semiconductor package may include a metallized die backside; the lower surface of the second semiconductor package may include at least one thermally conductive region; and the thermally conductive member may include at least one conductive element thermally conductively coupled to at least a portion of the metallized die backside and at least a portion of the thermally conductive region disposed on the lower surface of the second semiconductor package.

Example 39 may include elements of example 38 where the at least one conductive element may include a uniform layer of thermally conductive material disposed between and thermally conductively coupled to at least a portion of the metallized die backside and at least a portion of the at least one thermally conductive region disposed on the lower surface of the second semiconductor package.

Example 40 may include elements of example 39 where the uniform layer of thermally conductive material may include a uniform layer of solder reflowed between the metallized die backside and the at least one thermally conductive region.

Example 41 may include elements of example 38 where the at least one conductive element comprises a plurality of thermally conductive elements, each formed from a thermally conductive material disposed between and thermally conductively coupled to at least a portion of the metallized die backside of the first semiconductor package and at least a portion of the at least one thermally conductive region disposed on the lower surface of the second semiconductor package.

Example 42 may include elements of example 41 where the plurality of thermally conductive elements may include a plurality of solder pieces, each of the plurality of solder pieces reflowed between the metallized die backside and a respective one of the at least one thermally conductive regions.

Example 43 may include elements of example 38 where the metallized portion of the upper surface of the first semiconductor package may include a metallization layer that includes at least one of: copper, a copper alloy, gold, a gold alloy, or solder.

Example 44 may include elements of example 38 where the metallized portion of the upper surface of the first semiconductor package may include a metallization layer that includes at least one of: a sinterable paste material or a thermally conductive adhesive.

Example 45 may include elements of example 37 where the thermally conductive member may include: a core material having an upper surface and a lower surface; a plurality of thermally conductive through vias extending continuously from the upper surface of the core material to the lower surface of the core material, the plurality of thermally conductive through vias to thermally conductively couple the upper surface of the first semiconductor package to the lower surface of the second semiconductor package; and a plurality of electrically conductive through vias extending continuously from the upper surface of the core material to the lower surface of the core material, the plurality of electrically conductive through vias to electrically conductively couple the first semiconductor package to the second semiconductor package.

Example 46 may include elements of example 45 where the plurality of thermally conductive through vias may include through vias containing at least one of: copper or a copper containing alloy.

Example 47 may include elements of example 45 where each of the plurality of thermally conductive through vias include a thermally conductive through via having a diameter of from 30 micrometers (μm) to 100 μm; and where the plurality of thermally conductive through vias include thermally conductive through vias disposed a pitch of from about 100 micrometers (μm) to about 500 μm.

Example 48 may include elements of example 45 where the plurality of thermally conductive through vias may include at least one thermally conductive through via disposed proximate an area of the upper surface of the first semiconductor package that, in operation, attains an elevated temperature.

Example 49 may include elements of example 48 where the thermally conductive member may further include a metallized layer disposed across at least a portion of the upper surface of the thermally conductive member, the metallized layer disposed across at least a portion of the plurality of thermally conductive through vias.

Example 50 may include elements of example 49 where the thermally conductive member may further include a plurality of pads disposed on the lower surface of the thermally conductive member, each of the plurality of pads disposed proximate a respective one of the plurality of thermally conductive through vias.

Example 51 may include elements of example 50 where each of the plurality of pads may include a pad having a diameter of from about 70 micrometers (μm) to 150 μm.

Example 52 may include elements of example 51 where the metallized layer may include a metallized layer containing at least one of: copper, a copper containing alloy, gold, a gold containing alloy, or a thermally conductive solder.

Example 53 may include elements of example 52 where the metallized layer may include a metallized layer having a thickness of from 5 micrometers (μm) to 25 μm.

Example 54 may include elements of example 49 where the thermally conductive member may further include: a first solder resist layer disposed on the upper surface of the core material between at least some of the plurality of thermally conductive through vias and at least some of the plurality of electrically conductive through vias; and a second solder resist layer disposed on the lower surface of the core material between at least some of the plurality of thermally conductive through vias and at least some of the plurality of electrically conductive through vias.

According to example 55, there is provided a package-on-package (PoP) semiconductor package fabrication system. The system may include: means for disposing an thermally conductive member between an upper surface of a first semiconductor package and a lower surface of a second semiconductor package; wherein the thermally conductive member includes at least one continuous metallic, thermally conductive, member; means for physically coupling the thermally conductive member to the upper surface of the first semiconductor package and the lower surface of the second semiconductor package; and means for thermally conductively coupling the thermally conductive member to the upper surface of the first semiconductor package and the lower surface of the second semiconductor package.

Example 56 may include elements of example 55 where the means for disposing an thermally conductive member between an upper surface of a first semiconductor package and a lower surface of a second semiconductor package may include: means for disposing an thermally conductive member between an upper surface of a first semiconductor package that includes a metallized die backside and a lower surface of the second semiconductor package that includes at least one thermally conductive region.

Example 57 may include elements of example 56 where the means for thermally conductively coupling the thermally conductive member to the upper surface of the first semiconductor package and the lower surface of the second semiconductor package may include: means for thermally conductively coupling at least one conductive element included in the thermally conductive member to at least a portion of the metallized die backside disposed on the upper surface of the first semiconductor package and at least a portion of the thermally conductive region disposed on the lower surface of the second semiconductor package.

Example 58 may include elements of example 57 where the means for thermally conductively coupling at least one conductive element included in the thermally conductive member to at least a portion of the metallized die backside disposed on the upper surface of the first semiconductor package and at least a portion of the thermally conductive region disposed on the lower surface of the second semiconductor package may include: means for thermally conductively coupling a uniform layer of thermally conductive material between at least a portion of the metallized die backside disposed on the upper surface of the first semiconductor package and at least a portion of the at least one thermally conductive region disposed on the lower surface of the second semiconductor package.

Example 59 may include elements of example 58 where the means for thermally conductively coupling a uniform layer of thermally conductive material between at least a portion of the metallized die backside disposed on the upper surface of the first semiconductor package and at least a portion of the at least one thermally conductive region disposed on the lower surface of the second semiconductor package may include: means for reflowing a uniform layer of solder between at least a portion of the metallized die backside disposed on the upper surface of the first semiconductor package and at least a portion of the at least one thermally conductive region disposed on the lower surface of the second semiconductor package.

Example 60 may include elements of example 57 where the means for thermally conductively coupling at least one conductive element included in the thermally conductive member to at least a portion of the metallized die backside disposed on the upper surface of the first semiconductor package and at least a portion of the thermally conductive region disposed on the lower surface of the second semiconductor package may include: means for thermally conductively coupling each of a plurality of thermally conductive elements, each formed from a thermally conductive material to at least a portion of the metallized die backside of the first semiconductor package and at least a portion of the at least one thermally conductive region disposed on the lower surface of the second semiconductor package.

Example 61 may include elements of example 60 where the means for thermally conductively coupling each of a plurality of thermally conductive elements, each formed from a thermally conductive material to at least a portion of the metallized die backside of the first semiconductor package and at least a portion of the at least one thermally conductive region disposed on the lower surface of the second semiconductor package may include: means for reflowing each of a plurality of solder pieces between the metallized die backside disposed on the upper surface of the first semiconductor package and at least a portion of the at least one thermally conductive region disposed on the lower surface of the second semiconductor package.

Example 62 may include elements of example 56 where the means for disposing an thermally conductive member between an upper surface of a first semiconductor package that includes a metallized die backside and a lower surface of the second semiconductor package that includes at least one thermally conductive region may include: means for disposing an thermally conductive member between an upper surface of a first semiconductor package that includes a metallized die backside that includes as metallized layer containing at least one of: copper, a copper alloy, gold, a gold alloy, or solder.

Example 63 may include elements of example 56 where the means for disposing an thermally conductive member between an upper surface of a first semiconductor package that includes a metallized die backside and a lower surface of the second semiconductor package that includes at least one thermally conductive region may include: means for disposing an thermally conductive member between an upper surface of a first semiconductor package that includes a metallized die backside that includes as metallized layer containing at least one of: a sinterable paste material or a thermally conductive adhesive.

Example 64 may include elements of example 56 where the means for disposing an thermally conductive member between an upper surface of a first semiconductor package that includes a metallized die backside and a lower surface of the second semiconductor package that includes at least one thermally conductive region may include: means for thermally conductively coupling a plurality of thermally conductive through vias to the upper surface of the first semiconductor package and to the lower surface of the second semiconductor package, each of the plurality of thermally conductive through vias extending continuously from an upper surface of an thermally conductive member core material to the lower surface of the thermally conductive member core material; and means for communicably coupling a plurality of electrically conductive through vias between the first semiconductor package and the second semiconductor package, each of the plurality of electrically conductive through vias extending continuously from the upper surface of the core material to the lower surface of the core material.

Example 65 may include elements of example 64 where the means for thermally conductively coupling a plurality of thermally conductive through vias to the upper surface of the first semiconductor package and to the lower surface of the second semiconductor package may include: means for thermally conductively coupling a plurality of thermally conductive through vias that contain at least one of: copper or a copper containing alloy to the upper surface of the first semiconductor package and to the lower surface of the second semiconductor package.

Example 66 may include elements of example 65 where the means for thermally conductively coupling a plurality of thermally conductive through vias to the upper surface of the first semiconductor package and to the lower surface of the second semiconductor package may include: means for thermally conductively coupling a plurality of thermally conductive through vias having a diameter of from 30 micrometers ($\mu m$) to 100 $\mu m$ on a pitch of from about 100 $\mu m$ to about 500 $\mu m$ between the upper surface of the first semiconductor package and the lower surface of the second semiconductor package.

Example 67 may include elements of example 65 where the means for thermally conductively coupling a plurality of thermally conductive through vias to the upper surface of the first semiconductor package and to the lower surface of the second semiconductor package may include: means for disposing a metallized layer on at least a portion of the upper surface of the thermally conductive member; means for thermally conductively coupling the metallized layer to at least some of each of the plurality of thermally conductive through vias; and means for thermally conductively coupling the metallized layer to the lower surface of the second semiconductor package.

Example 68 may include elements of example 67 where the means for thermally conductively coupling a plurality of thermally conductive through vias to the upper surface of the first semiconductor package and to the lower surface of the second semiconductor package may include: means for disposing a plurality of thermally conductive pads on the lower surface of the thermally conductive member; means for thermally conductively coupling each of the plurality of thermally conductive pads top a respective one of the plurality of thermally conductive through vias; and means for thermally conductively coupling each of at least some of the plurality of thermally conductive pads to the upper surface of the first semiconductor package.

Example 69 may include elements of example 68 where the means for disposing a plurality of thermally conductive pads on the lower surface of the thermally conductive member may include: means for disposing a plurality of conductive pads having a diameter of from about 70 micrometers (μm) to 150 μm on the lower surface of the thermally conductive member.

Example 70 may include elements of example 69 where the means for disposing a metallized layer on at least a portion of the upper surface of the thermally conductive member may include: means for disposing a metallized layer containing at least one of: copper, a copper containing alloy, gold, a gold containing alloy, or a thermally conductive solder on at least a portion of the upper surface of the thermally conductive member.

Example 71 may include elements of example 70 where the means for disposing a metallized layer on at least a portion of the upper surface of the thermally conductive member may further include: means for disposing a metallized layer having a thickness of from 5 micrometers (μm) to 25 μm on at least a portion of the upper surface of the thermally conductive member.

Example 72 may include elements of example 68 where the means for disposing an thermally conductive member between an upper surface of a first semiconductor package and a lower surface of a second semiconductor package; wherein the thermally conductive member includes at least one continuous metallic, thermally conductive, member may include: means for disposing an thermally conductive member between an upper surface of a first semiconductor package and a lower surface of a second semiconductor package; wherein the thermally conductive member includes at least one continuous metallic, thermally conductive, member, the thermally conductive member including: a first solder resist layer disposed on the upper surface of the thermally conductive member between at least some of the plurality of thermally conductive through vias and at least some of the plurality of electrically conductive through vias; and a second solder resist layer disposed on the lower surface of the thermally conductive member between at least some of the first plurality of metallic through vias and at least some of the second plurality of metallic through vias.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A package-on-package (PoP) semiconductor package comprising:
   a first semiconductor package having an upper surface and a lower surface, the first semiconductor package comprising a die, wherein the die of the first semiconductor package has a lateral width;
   a first thermally conductive region disposed on the die of the first semiconductor package, wherein the first thermally conductive region has a lateral width no greater than the lateral width of the die of the first semiconductor package;
   a second semiconductor package having an upper surface and a lower surface, the second semiconductor package comprising a die;
   a second thermally conductive region disposed proximate at least a portion of the lower surface of the second semiconductor package, the second thermally conductive region vertically beneath the die of the second semiconductor package; and
   a thermally conductive member disposed between the first semiconductor package and the second semiconductor package, a lower surface of the thermally conductive member disposed proximate and thermally coupled to at least a portion of the first thermally conductive region and an upper surface of the thermally conductive member disposed proximate and thermally coupled to at least a portion of the second thermally conductive region;
   wherein the thermally conductive member includes at least one continuous metallic, thermally conductive pathway between the upper surface of the first semiconductor package and the lower surface of the second semiconductor package.

2. The PoP semiconductor package of claim 1, wherein:
   the upper surface of the first semiconductor package comprises a metallized die backside; and
   the thermally conductive member comprises at least one thermally conductive element thermally conductively coupled to at least a portion of the metallized die backside and at least a portion of the second thermally conductive region disposed on the lower surface of the second semiconductor package.

3. The PoP semiconductor package of claim 2 wherein the at least one conductive element comprises a uniform layer of thermally conductive material disposed between and thermally conductively coupled to at least a portion of the metallized die backside and at least a portion of the second thermally conductive region disposed on the lower surface of the second semiconductor package.

4. The PoP semiconductor package of claim 3 wherein the uniform layer of thermally conductive material comprises a uniform layer of solder reflowed between the metallized die backside and the second thermally conductive region.

5. The PoP semiconductor package of claim 2 wherein the at least one conductive element comprises a plurality of thermally conductive elements, each formed from a thermally conductive material disposed between and thermally conductively coupled to at least a portion of the metallized die backside of the first semiconductor package and at least a portion of the second thermally conductive region disposed on the lower surface of the second semiconductor package.

6. The PoP semiconductor package of claim 5 wherein the plurality of thermally conductive elements comprise a plurality of solder pieces, each of the plurality of solder pieces reflowed between the metallized die backside and the second thermally conductive region.

7. The PoP semiconductor package of claim 2 wherein the metallized portion of the upper surface of the first semiconductor package comprises a metallization layer that includes at least one of: copper, a copper alloy, gold, a gold alloy, or solder.

8. The PoP semiconductor package of claim 2 wherein the metallized portion of the upper surface of the first semiconductor package comprises a metallization layer that includes at least one of: a sinterable paste material or a thermally conductive adhesive.

9. The PoP semiconductor package of claim 1 wherein the thermally conductive member includes an interposer layer comprising:
   a dielectric core material having an upper surface and a lower surface;
   a plurality of thermally conductive through vias extending continuously from the upper surface of the core material to the lower surface of the core material, the plurality of thermally conductive through vias to thermally conductively couple the upper surface of the first semiconductor package to the lower surface of the second semiconductor package; and a plurality of electrically conductive through vias extending continuously from the upper surface of the core material to the lower surface of the core material, the plurality of electrically conductive through vias to electrically conductively couple the first semiconductor package to the second semiconductor package.

10. The PoP semiconductor package of claim 9 wherein the plurality of thermally conductive through vias comprise through vias containing at least one of: copper or a copper containing alloy.

11. The PoP semiconductor package of claim 9:
wherein each of the plurality of thermally conductive through vias include a thermally conductive through via having a diameter of from 30 micrometers (μm) to 100 μm; and
wherein the plurality of thermally conductive through vias include thermally conductive through vias disposed a pitch of from about 100 micrometers (μm) to about 500 μm.

12. The PoP semiconductor package of claim 9 wherein the plurality of thermally conductive through vias includes at least one thermally conductive through via disposed proximate an area of the upper surface of the first semiconductor package that, in operation, attains an elevated temperature.

13. A package-on-package (PoP) semiconductor package fabrication method, comprising:
disposing a first thermally conductive region on a die of a first semiconductor package, wherein the die of the first semiconductor package has a lateral width, and wherein the first thermally conductive region has a lateral width no greater than the lateral width of the die of the first semiconductor package;
disposing a second thermally conductive region proximate at least a portion of a lower surface of a second semiconductor package, the second semiconductor package comprising a die, and the second thermally conductive region vertically beneath the die of the second semiconductor package;
disposing a thermally conductive member between the upper surface of a first semiconductor package and the lower surface of a second semiconductor;
wherein the thermally conductive member includes at least one continuous metallic, thermally conductive, member;
physically and thermally conductively coupling at least a portion of a lower surface of the thermally conductive member to at least a portion of the first thermally conductive region; and
physically and thermally conductively coupling at least a portion of an upper surface of the thermally conductive member to at least a portion of the second thermally conductive region.

14. The method of claim 13 wherein disposing an thermally conductive member between an upper surface of a first semiconductor package and a lower surface of a second semiconductor package comprises:
disposing the thermally conductive member between an upper surface of a first semiconductor package that includes a metallized die backside and a lower surface of the second semiconductor package that includes at least one thermally conductive region.

15. The method of claim 14 wherein thermally conductively coupling the thermally conductive member to the upper surface of the first semiconductor package and the lower surface of the second semiconductor package comprises:
thermally conductively coupling at least one conductive element included in the thermally conductive member to at least a portion of the metallized die backside disposed on the upper surface of the first semiconductor package and at least a portion of the thermally conductive region disposed on the lower surface of the second semiconductor package.

16. The method of claim 15 wherein thermally conductively coupling at least one conductive element included in the thermally conductive member to at least a portion of the metallized die backside disposed on the upper surface of the first semiconductor package and at least a portion of the thermally conductive region disposed on the lower surface of the second semiconductor package comprises:
thermally conductively coupling a uniform layer of thermally conductive material between at least a portion of the metallized die backside disposed on the upper surface of the first semiconductor package and at least a portion of the at least one thermally conductive region disposed on the lower surface of the second semiconductor package.

17. The method of claim 16 wherein thermally conductively coupling a uniform layer of thermally conductive material between at least a portion of the metallized die backside disposed on the upper surface of the first semiconductor package and at least a portion of the at least one thermally conductive region disposed on the lower surface of the second semiconductor package comprises:
reflowing a uniform layer of solder between at least a portion of the metallized die backside disposed on the upper surface of the first semiconductor package and at least a portion of the at least one thermally conductive region disposed on the lower surface of the second semiconductor package.

18. The method of claim 14 wherein thermally conductively coupling at least one conductive element included in the thermally conductive member to at least a portion of the metallized die backside disposed on the upper surface of the first semiconductor package and at least a portion of the thermally conductive region disposed on the lower surface of the second semiconductor package comprises:
thermally conductively coupling each of a plurality of thermally conductive elements, each formed from a thermally conductive material to at least a portion of the metallized die backside of the first semiconductor package and at least a portion of the at least one thermally conductive region disposed on the lower surface of the second semiconductor package.

19. The method of claim 18 wherein thermally conductively coupling each of a plurality of thermally conductive elements, each formed from a thermally conductive material to at least a portion of the metallized die backside of the first semiconductor package and at least a portion of the at least one thermally conductive region disposed on the lower surface of the second semiconductor package comprises:
reflowing each of a plurality of solder pieces between the metallized die backside disposed on the upper surface of the first semiconductor package and at least a portion of the at least one thermally conductive region disposed on the lower surface of the second semiconductor package.

20. A package-on-package (PoP) semiconductor package fabrication system, comprising:

means for disposing a first thermally conductive region on a die of a first semiconductor package, wherein the die of the first semiconductor package has a lateral width, and wherein the first thermally conductive region has a lateral width no greater than the lateral width of the die of the first semiconductor package;

means for disposing a second thermally conductive region proximate at least a portion of a lower surface of a second semiconductor package, the second semiconductor package comprising a die, and the second thermally conductive region vertically beneath the die of the second semiconductor package;

means for disposing a thermally conductive member between the upper surface of a first semiconductor package and the lower surface of a second semiconductor package;

wherein the thermally conductive member includes at least one continuous metallic, thermally conductive, member;

means for physically and thermally conductively coupling at least a portion of a lower surface of the thermally conductive member to at least a portion of the first thermally conductive region; and means for physically and thermally conductively coupling at least a portion of an upper surface of the thermally conductive member to at least a portion of the second thermally conductive region.

21. The system of claim 20 wherein the means for disposing an thermally conductive member between an upper surface of a first semiconductor package and a lower surface of a second semiconductor package comprises:

means for disposing a thermally conductive member between an upper surface of a first semiconductor package that includes a metallized die backside and a lower surface of the second semiconductor package that includes at least one thermally conductive region.

22. The system of claim 21 wherein the means for thermally conductively coupling the thermally conductive member to the upper surface of the first semiconductor package and the lower surface of the second semiconductor package comprises:

means for thermally conductively coupling at least one conductive element included in the thermally conductive member to at least a portion of the metallized die backside disposed on the upper surface of the first semiconductor package and at least a portion of the thermally conductive region disposed on the lower surface of the second semiconductor package.

23. The system of claim 22 wherein the means for thermally conductively coupling at least one conductive element included in the thermally conductive member to at least a portion of the metallized die backside disposed on the upper surface of the first semiconductor package and at least a portion of the thermally conductive region disposed on the lower surface of the second semiconductor package comprises:

means for thermally conductively coupling each of a plurality of thermally conductive elements, each formed from a thermally conductive material to at least a portion of the metallized die backside of the first semiconductor package and at least a portion of the at least one thermally conductive region disposed on the lower surface of the second semiconductor package.

24. The system of claim 20 wherein the means for disposing an thermally conductive member between an upper surface of a first semiconductor package that includes a metallized die backside and a lower surface of the second semiconductor package that includes at least one thermally conductive region comprises:

means for thermally conductively coupling a plurality of thermally conductive through vias to the upper surface of the first semiconductor package and to the lower surface of the second semiconductor package, each of the plurality of thermally conductive through vias extending continuously from an upper surface of a core material to the lower surface of the core material; and means for communicably coupling a plurality of electrically conductive through vias between the first semiconductor package and the second semiconductor package, each of the plurality of electrically conductive through vias extending continuously from the upper surface of the core material to the lower surface of the core material.

25. The system of claim 24 wherein the means for thermally conductively coupling a plurality of thermally conductive through vias to the upper surface of the first semiconductor package and to the lower surface of the second semiconductor package comprises:

means for disposing a metallized layer on at least a portion of the upper surface of the thermally conductive member;

means for thermally conductively coupling the metallized layer to at least some of each of the plurality of thermally conductive through vias; and means for thermally conductively coupling the metallized layer to the lower surface of the second semiconductor package.

* * * * *